United States Patent
Hasegawa et al.

(10) Patent No.: US 10,109,454 B2
(45) Date of Patent: Oct. 23, 2018

(54) DIAGNOSIS METHOD, CHARGED PARTICLE BEAM LITHOGRAPHY APPARATUS, AND RECORDING MEDIUM

(71) Applicant: NuFlare Technology, Inc., Yokohama-shi (JP)

(72) Inventors: Kei Hasegawa, Kanagawa-ken (JP); Hayato Kimura, Shizuoka-ken (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/437,514

(22) Filed: Feb. 21, 2017

(65) Prior Publication Data
US 2017/0243714 A1  Aug. 24, 2017

(30) Foreign Application Priority Data
Feb. 23, 2016  (JP) .................. 2016-032249

(51) Int. Cl.
*H01J 37/22* (2006.01)
*H01J 37/317* (2006.01)
*H01J 37/302* (2006.01)

(52) U.S. Cl.
CPC .......... *H01J 37/222* (2013.01); *H01J 37/302* (2013.01); *H01J 37/3177* (2013.01); *H01J 2237/0437* (2013.01); *H01J 2237/30416* (2013.01); *H01J 2237/31762* (2013.01); *H01J 2237/31774* (2013.01)

(58) Field of Classification Search
CPC ...... H01J 37/045; H01J 37/222; H01J 37/302; H01J 37/3177; H01J 2237/0437; H01J 2237/30416; H01J 2237/31762; H01J 2237/31774
See application file for complete search history.

(56) References Cited

U.S. PATENT DOCUMENTS 5,866,300 A * 2/1999 Satoh ............... B82Y 10/00
                                              250/492.3
6,057,907 A    5/2000 Satoh et al.

FOREIGN PATENT DOCUMENTS

JP   H08-297586 A   11/1996
JP   H09-74060 A    3/1997

* cited by examiner

*Primary Examiner* — David E Smith
(74) *Attorney, Agent, or Firm* — Oblon, McClelland, Maier & Neustadt, L.L.P.

(57) ABSTRACT

Disclosed is a method of diagnosing a conversion process for converting a format of image data including unit data corresponding to charged particle beams into a format suitable for an aperture array, the aperture array having a plurality of controllers provided to match a plurality of the charged particle beams to control the charged particle beams, and a driver configured to drive the controllers. The method includes: extracting the unit data having an identical first rank based on an arrangement of the unit data in the image data from the unit data of each block including a predetermined number of the unit data and calculating a first checksum of each of the first rank; extracting the unit data having an identical second rank after the conversion process from the unit data of each block and calculating a second checksum of each of the second rank; and comparing the first and second checksums.

20 Claims, 30 Drawing Sheets

FIG.22
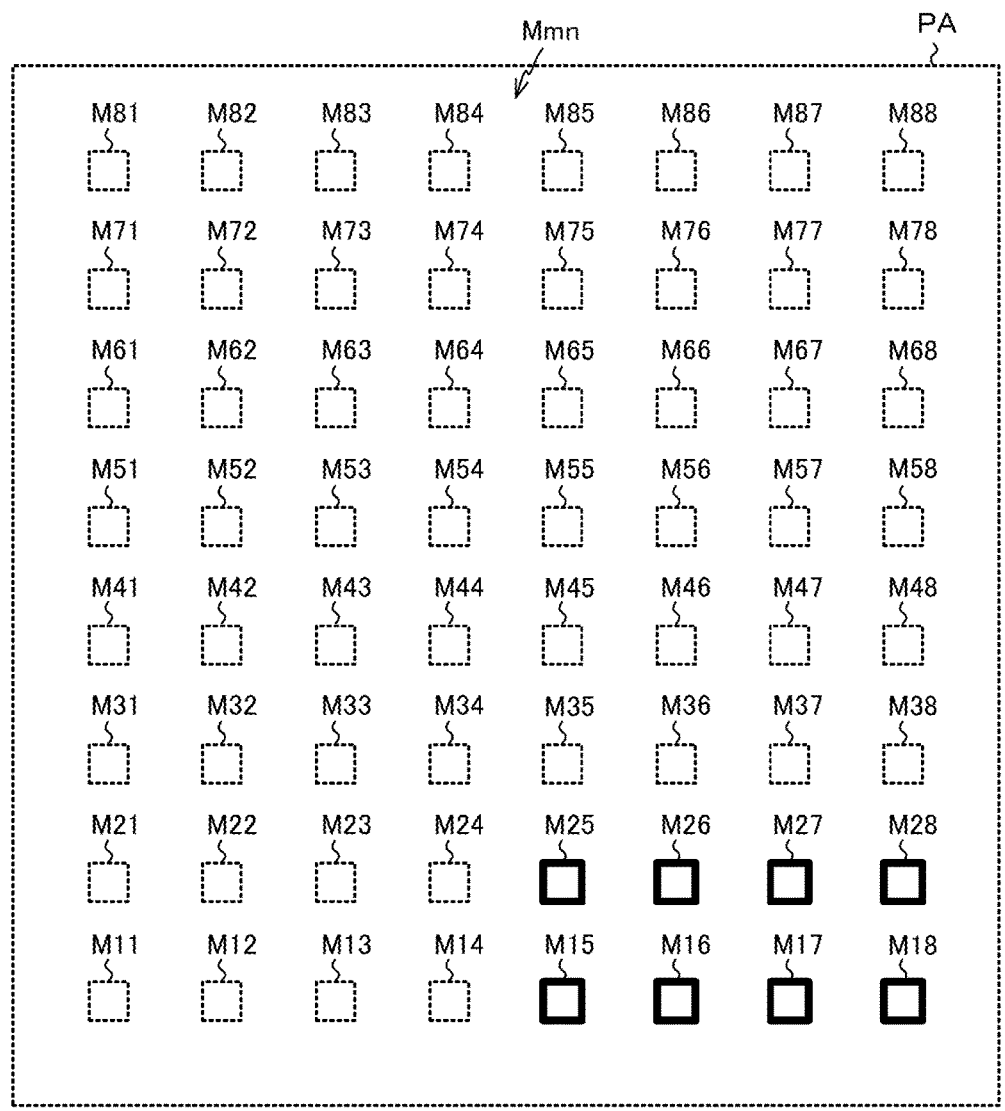
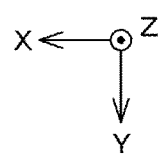

ARRANGEMENT RANKS

RANKS BASED ON SORTING RULE

ARRANGEMENT RANKS

RANKS BASED ON SORTING RULE

FIG.31

| CHECKSUM | | UNIT DATA |
|---|---|---|
| CS1 | ACS4 | D1+D3+D5+D7+D17+D19+D21+D23 |
| CS2 | ACS3 | D2+D4+D6+D8+D18+D20+D22+D24 |
| CS3 | ACS2 | D9+D11+D13+D15+D25+D27+D29+D31 |
| CS4 | ACS1 | D10+D12+D14+D16+D26+D28+D30+D32 |
| CS5 | ACS6 | D33+D35+D37+D39+D49+D51+D53+D55 |
| CS6 | ACS5 | D34+D36+D38+D40+D50+D52+D54+D56 |
| CS7 | ACS8 | D41+D43+D45+D47+D57+D59+D61+D63 |
| CS8 | ACS7 | D42+D44+D46+D48+D58+D60+D62+D64 |

DIAGNOSIS METHOD, CHARGED PARTICLE BEAM LITHOGRAPHY APPARATUS, AND RECORDING MEDIUM

CROSS-REFERENCE TO RELATED APPLICATION

This application is based upon and claims the benefit of priority from the prior Japanese Patent Applications No. 2016-032249 filed in Japan on Feb. 23, 2016; the entire contents of which are incorporated herein by reference.

FIELD

The present disclosure relates to a diagnosis method, a charged particle beam lithography apparatus, and a recording medium.

BACKGROUND

In a semiconductor device lithography process, an original pattern formed on a mask is transferred to a wafer serving as a substrate of the semiconductor device. Drawing of the original pattern onto the mask is performed, for example, using an electron beam lithography apparatus.

In recent years, in order to improve a throughput, a multi-beam type electron beam lithography apparatus capable of drawing a pattern using a plurality of electron beams has come into use. In such a type of the electron beam lithography apparatus, an electron beam emitted from a single electron source is divided into multiple beams (multiplexed) as the electron beam passes through an aperture having a plurality of holes. The ON/OFF control of multiple electron beams are independently performed, for example, by a blanking aperture array (BAA).

Since the BAA is disposed in a vacuum lens barrel provided with an electron gun or the like for emitting an electron beam, its size is restricted. For this reason, a data format processed by the BAA is selected such that a control circuit of the BAA becomes as simple as possible. Meanwhile, image data of the pattern drawn by the electron beam lithography apparatus is designed, for example, using a computer-aided design (CAD) tool and is output in a bitmap format.

In order to perform the ON/OFF control of the electron beam using the BAA, it is necessary to convert the image data representing the pattern to be drawn into a format suitable for an interface of the BAA.

If an error occurs in conversion of the image data described above, a product yield is degraded. Thus, various techniques for avoiding such a patterning error have been proposed.

In the prior art, an error of the drawing data is detected by comparing a checksum of the data obtained before being supplied to the BAA and a checksum of the data supplied to the BAA. In the technique of JP H08-297586 A, a damage of the drawing data is detected by calculating and comparing an expected parity bit of the data obtained after sorting. In the technique of JP H09-74060 A (corresponding to U.S. Pat. No. 5,866,300), however, it is difficult to detect a conversion error while the damaged data can be detected. In the technique of JP H08-297586 A, for example, if a conversion error occurs due to a change of the data arrangement sequence, a parity check may be successful erroneously. Thus, it is difficult to detect abnormality. For this reason, if a conversion error described above occurs, a long time is necessary to perform troubleshooting. As a result, a system downtime may be prolonged.

BRIEF DESCRIPTION OF THE DRAWINGS

FIG. 22 is a diagram for describing a drawing process of the circuit pattern;
FIG. 31 is a diagram for describing a process of comparing the checksum.

DETAILED DESCRIPTION

Figure 1:
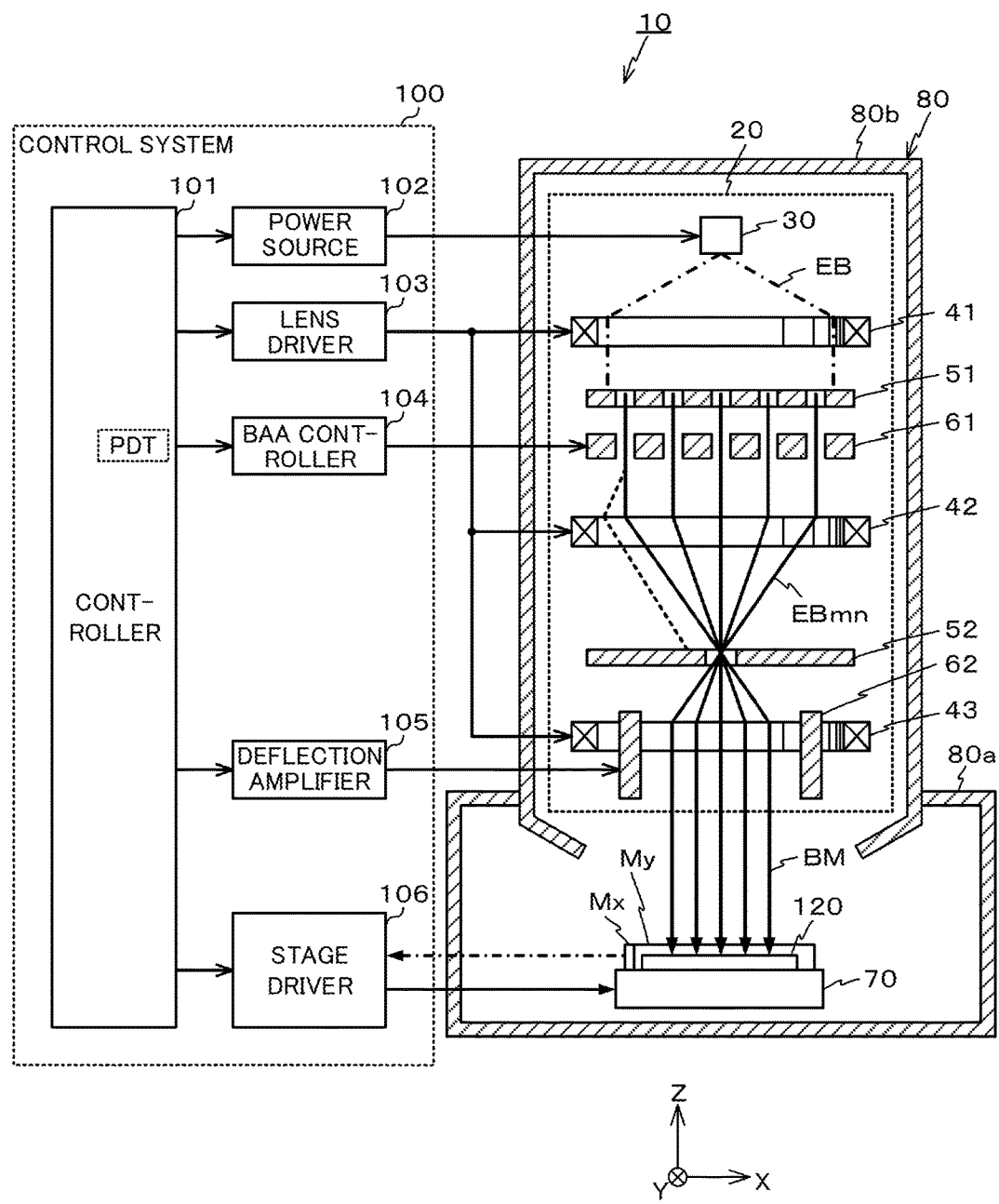
FIG. 1 is a schematic diagram illustrating a configuration of an electron beam lithography apparatus according to an embodiment of the disclosure.

In accordance with an aspect of the present disclosure, there is provided a method of diagnosing a conversion process for converting a format of image data including unit data corresponding to charged particle beams into a format suitable for an aperture array, the aperture array having a plurality of controllers provided to match a plurality of the charged particle beams to control the charged particle beams and a driver configured to drive the controllers, the method including: extracting the unit data having an identical first rank based on an arrangement of the unit data in the image data from the unit data of each block including a predetermined number of the unit data and calculating a first checksum of each of the first rank; extracting the unit data having an identical second rank after the conversion process from the unit data of each of the blocks and calculating a second checksum of each of the second rank; and comparing the first and second checksums.

In accordance with another aspect of the present disclosure, there is provided a charged particle beam lithography apparatus including: an aperture array having a plurality of controllers provided to match a plurality of charged particle beams to control the charged particle beams and a driver configured to drive the controllers; a converter configured to convert a format of image data having unit data corresponding to the charged particle beams into a format suitable for the aperture array; a first calculator configured to extract the unit data having an identical first rank based on the arrangement of the unit data of the image data from the unit data of each block having a predetermined number of the unit data and calculate a first checksum for each of the first rank; a second calculator configured to extract the unit data having an identical second rank after the conversion of the converter from the unit data of each of the blocks and calculate a second checksum for each of the second ranks; and a first comparator configured to compare the first checksum with the second checksum.

A computer-readable recording medium storing a program for diagnosing a conversion process for converting a format of image data including unit data corresponding to charged particle beams into a format suitable for an aperture array, the aperture array having a plurality of controllers provided to match a plurality of the charged particle beams to control the charged particle beams, and a driver configured to drive the controllers, the program causing a computer to execute: extracting the unit data having an identical first rank based on an arrangement of the unit data in the image data from the unit data of each block including a predetermined number of the unit data and calculating a first checksum of each of the first rank; extracting the unit data having an identical second rank after the conversion process from the unit data of each of the blocks and calculating a second checksum of each of the second rank; and comparing the first checksum with the second checksum.

Embodiments of the present disclosure will be described below with reference to the accompanying drawings. In the description of the embodiments, a Cartesian coordinate system composed of X, Y, and Z axes perpendicular to each other is appropriately employed.

<Configuration of Apparatus>

FIG. 1 is a schematic diagram illustrating a configuration of an electron beam lithography apparatus 10 according to an embodiment of the disclosure. The electron beam lithography apparatus 10 is an apparatus for drawing a pattern using an electron beam on a specimen 120 such as a mask or reticle coated with a resist material under the vacuum environment.

As illustrated in FIG. 1, the electron beam lithography apparatus 10 includes an irradiator 20 that irradiates an electron beam EB onto the specimen 120, a stage 70 used to place the specimen 120, a vacuum chamber 80 that houses the irradiator 20 and the stage 70, and a control system 100 that controls the irradiator 20 and the stage 70.

The vacuum chamber 80 includes a writing chamber 80a that houses the stage 70 and a lens barrel 80b that houses the irradiator 20.

The writing chamber 80a is a rectangular parallelepiped hollow member and has a circular opening on its upper surface. The lens barrel 80b is a cylindrical casing whose longitudinal direction is parallel to the Z-axis direction. The lens barrel 80b is formed of, for example, stainless steel and is grounded. The lens barrel 80b is inserted into the inside of the writing chamber 80a from the opening provided on the upper surface of the writing chamber 80a. The internal vacuum levels of the writing chamber 80a and the lens barrel 80b are maintained, for example, at approximately $10^{-7}$ Pa.

The irradiator 20 includes an electron gun 30, lenses 41, 42, and 43, apertures 51 and 52, an aperture array 61, and a deflector 62. The electron gun 30, the lenses 41, 42, and 43, the apertures 51 and 52, the aperture array 61, and the deflector 62 are disposed inside the lens barrel 80b.

The electron gun 30 is disposed in an upper part inside the lens barrel 80b. The electron gun 30 is, for example, a hot cathode type electron gun. The electron gun 30 includes a cathode, a Wehnelt electrode provided to surround the cathode, an anode disposed under the cathode, and the like. When a voltage is applied, the electron gun 30 ejects the electron beam EB downward.

The lens 41 is an annular electromagnetic lens and is disposed under the electron gun 30. The lens 41 shapes the electron beam EB spreading downward so as to be parallel to a vertical direction.

Figure 2:
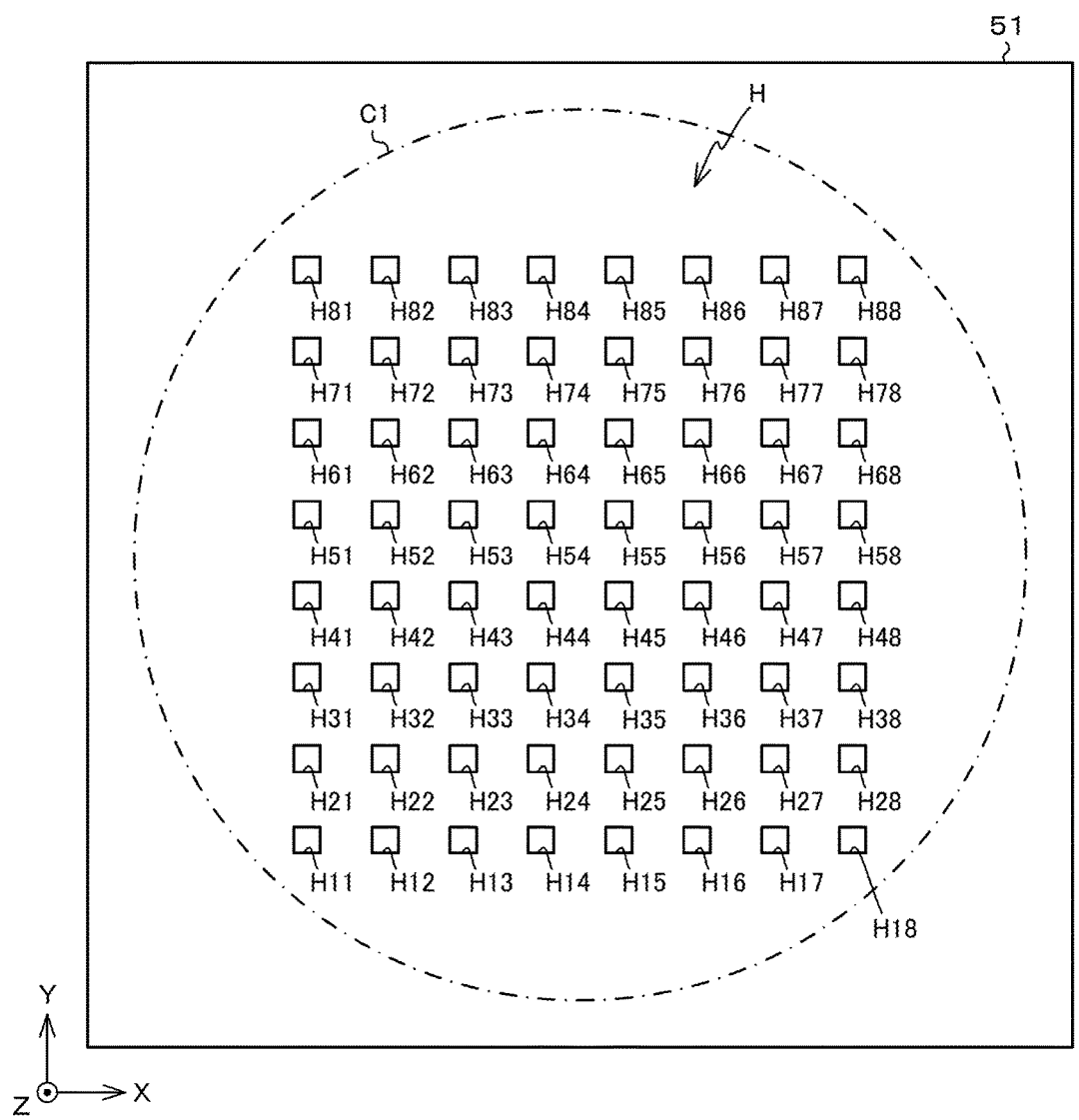
FIG. 2 is a top plan view illustrating an aperture.

The aperture 51 is a member for branching the incident electron beam EB into a plurality of electron beams EBmn. FIG. 2 is a top plan view illustrating the aperture 51. As illustrated in FIG. 2, the aperture 51 is a rectangular plate-shaped member. The aperture 51 is formed of, for example, a silicon-based material, and has a surface provided with a coating layer or a sputtering layer formed of, for example, chromium or the like. The aperture 51 has sixty four holes H arranged in an eight-row and eight-column matrix shape by setting a row direction to the X-axis direction and setting a column direction to the Y-axis direction. The hole H has a square shape whose each side is parallel to the X-axis or Y-axis. The dimensions of the holes H are approximately equal to each other in the X-axis and Y-axis directions.

In this embodiment, the sixty four holes H are expressed as "Hmn," where "m" and "n" denote integers 1 to 8. The hole located in the first row closest to zero in the Y-axis direction is denoted by "H1n." The holes located in the second to eighth rows are denoted by "H2n" to "H8n." The hole located in the first column closest to zero in the X-axis direction is denoted by "Hm1." The holes located in the second to eighth columns are denoted by "Hm2" to "Hm8."

Figure 3:
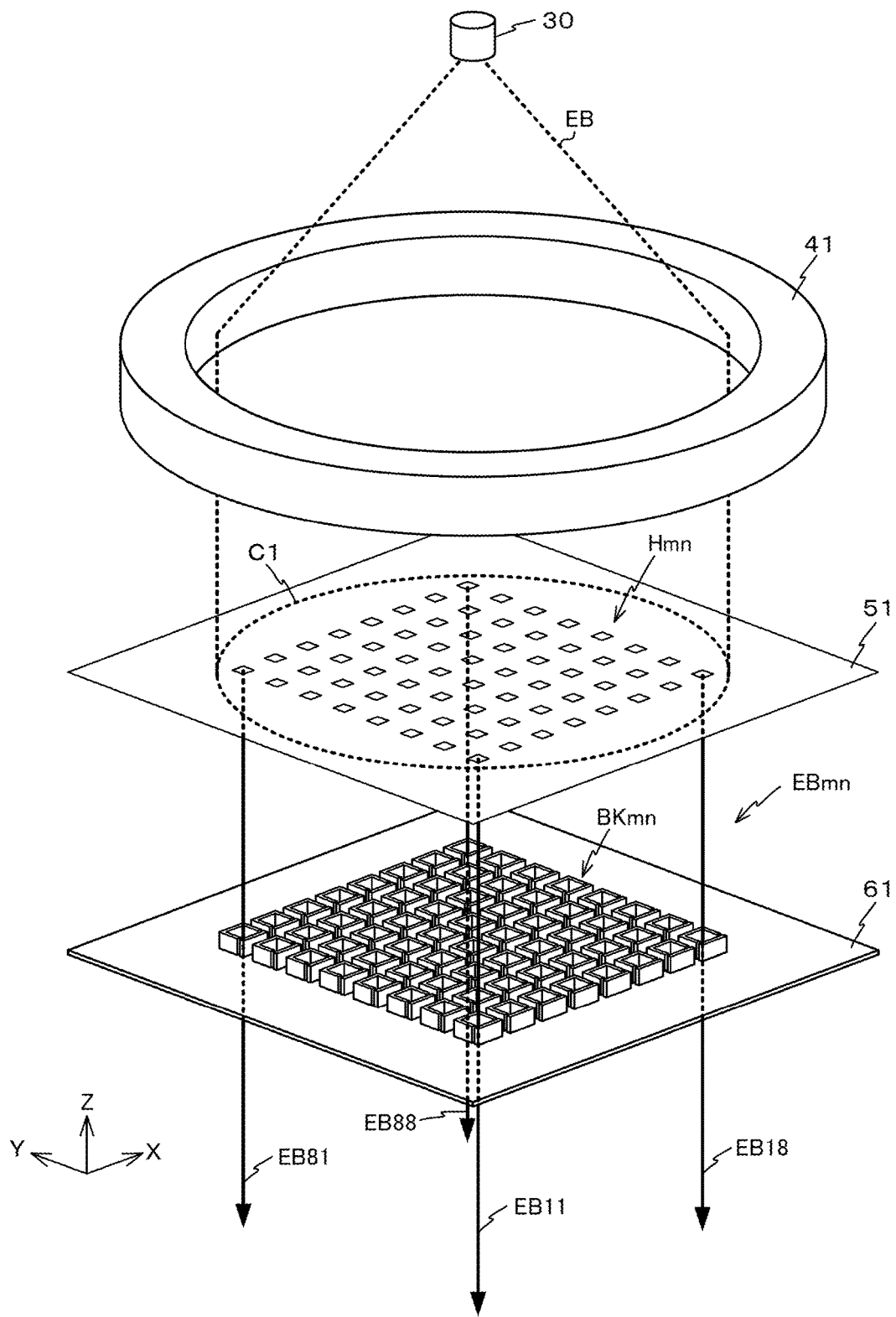
FIG. 3 is a perspective view illustrating an electron gun, a lens, an aperture, and an aperture array.

FIG. 3 is a perspective view illustrating the electron gun 30, the lens 41, the aperture 51, and the aperture array 61. As illustrated in FIG. 3, the electron beam EB ejected from the electron gun 30 is shaped by the lens 41 in parallel to the vertical axis. The shaped electron beam EB is incident to a circular area C1 indicated by a virtual line on the upper surface of the aperture 51. A part of the electron beams EB incident to the area C1 are blocked by the aperture 51, and the remaining electron beams EB pass through the holes Hmn of the aperture 51. As a result, the electron beam EB is divided (multiplexed) into 64 electron beams traveling vertically downward.

In this embodiment, the electron beam passing through the hole Hmn of the aperture 51 will be referred to as an electron beam EBmn. Note that, in FIG. 3, only the electron beams EB11, EB18, EB81, and EB88 passing through the holes H11, H18, H81, and H88, respectively are shown representatively.

Figure 4:
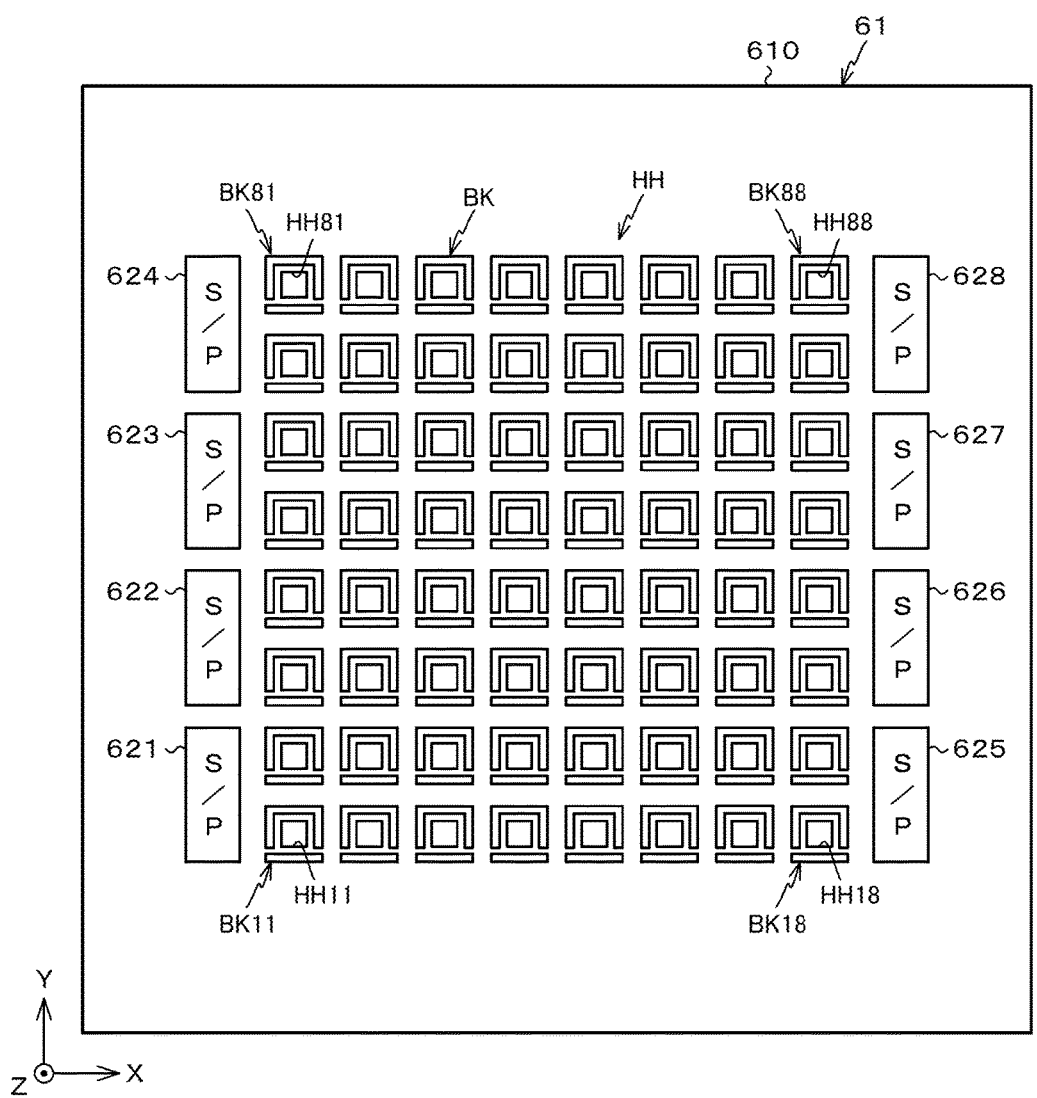
FIG. 4 is a top plan view illustrating the aperture array.

The aperture array 61 is a unit for individually blanking each electron beam EBmn. FIG. 4 is a top plan view illustrating the aperture array 61. As illustrated in FIG. 4, the aperture array 61 includes a substrate 610 and sixty four blankers BK provided on the upper surface (+Z-side surface) of the substrate 610.

The substrate 610 is a square substrate formed of, for example, silicon. The substrate 610 has sixty four holes HH arranged in an eight-row and eight-column matrix shape. Each of the sixty four holes HH is positioned under each of the holes H of the aperture 51. In this embodiment, the holes HH immediately under the holes Hmn will be expressed as "holes HHmn."

The hole HHmn is slightly larger than the hole Hmn. The electron beam EBmn passing through the hole Hmn can pass through the hole HHmn without interference of the substrate 610.

Figure 5:
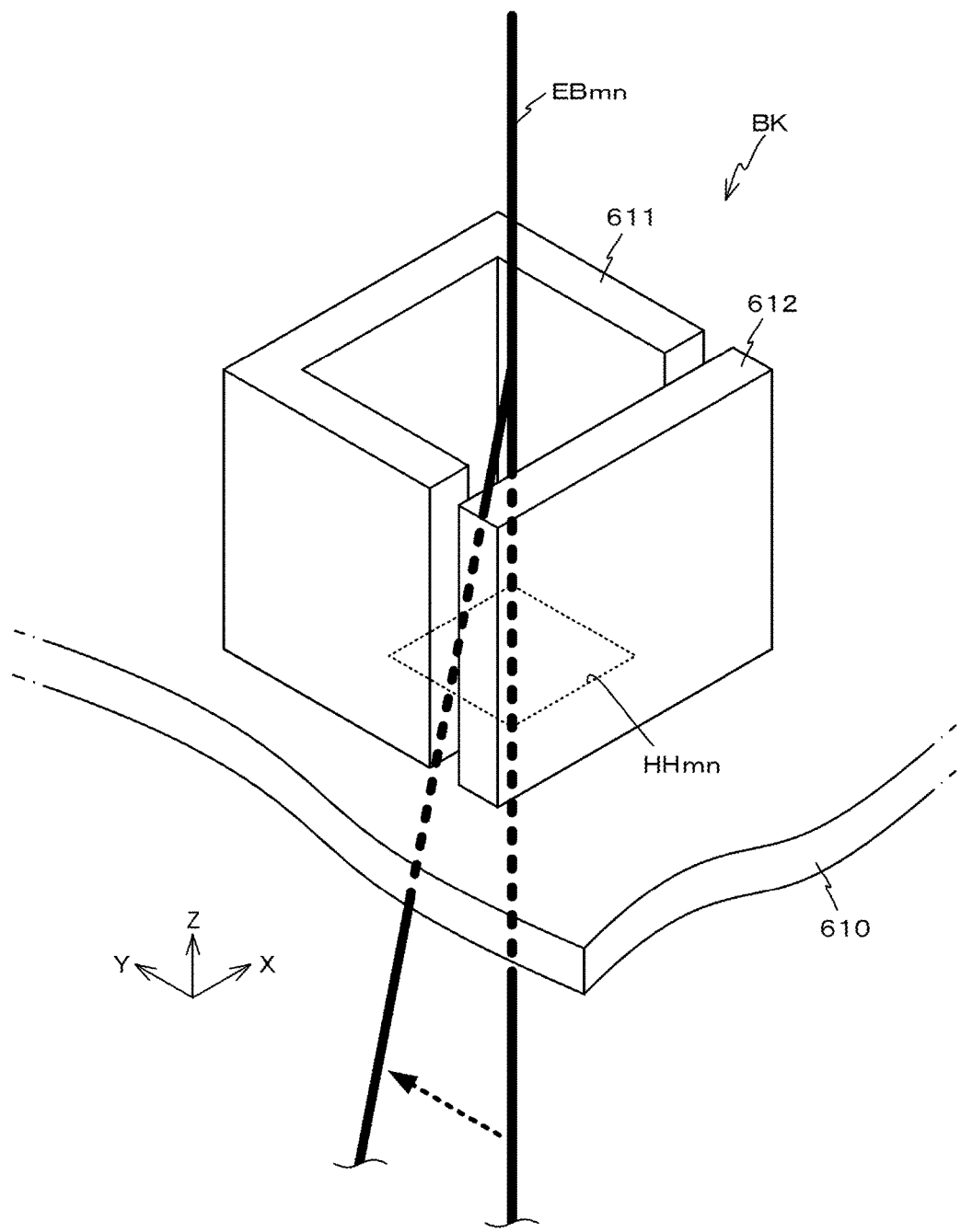
FIG. 5 is an enlarged perspective view illustrating a blanker.

FIG. 5 is an enlarged perspective view illustrating the blanker BK. The blanker BK includes a pair of electrodes 611 and 612 formed of, for example, metal such as copper. The electrode 611 is a member having a U-shaped X-Y cross section. The electrode 611 is disposed along the +X-side outer edge, the −X-side outer edge, and the +Y-side outer edge of the hole HHmn provided in the substrate 610. The electrode 612 is a plate-shaped electrode and is disposed along the −Y-side outer edge of the hole HHmn. As shown in FIG. 5, the electron beam EBmn passing through the aperture 51 passes through a gap between the electrodes 611 and 612 of the blanker BK and is then incident to the hole HHmn of the substrate 610.

As illustrated in FIG. 4, the blanker BK is provided in each hole HHmn. In this embodiment, the blanker BK provided in the hole HHmn will be expressed as a blanker BKmn.

The electrode 611 of the blanker BK of FIG. 5 is grounded through a circuit (not illustrated) provided in the substrate 610. In addition, as a voltage is applied to the electrode 612, the electron beam EBmn incident to the hole HHmn of the substrate 610 is deflected in the direction indicated by the arrow in FIG. 5. As a result, as illustrated in FIG. 1, the electron beam EBmn is blocked by the aperture 52, and the electron beam EBmn has a blanked state.

Figure 6:
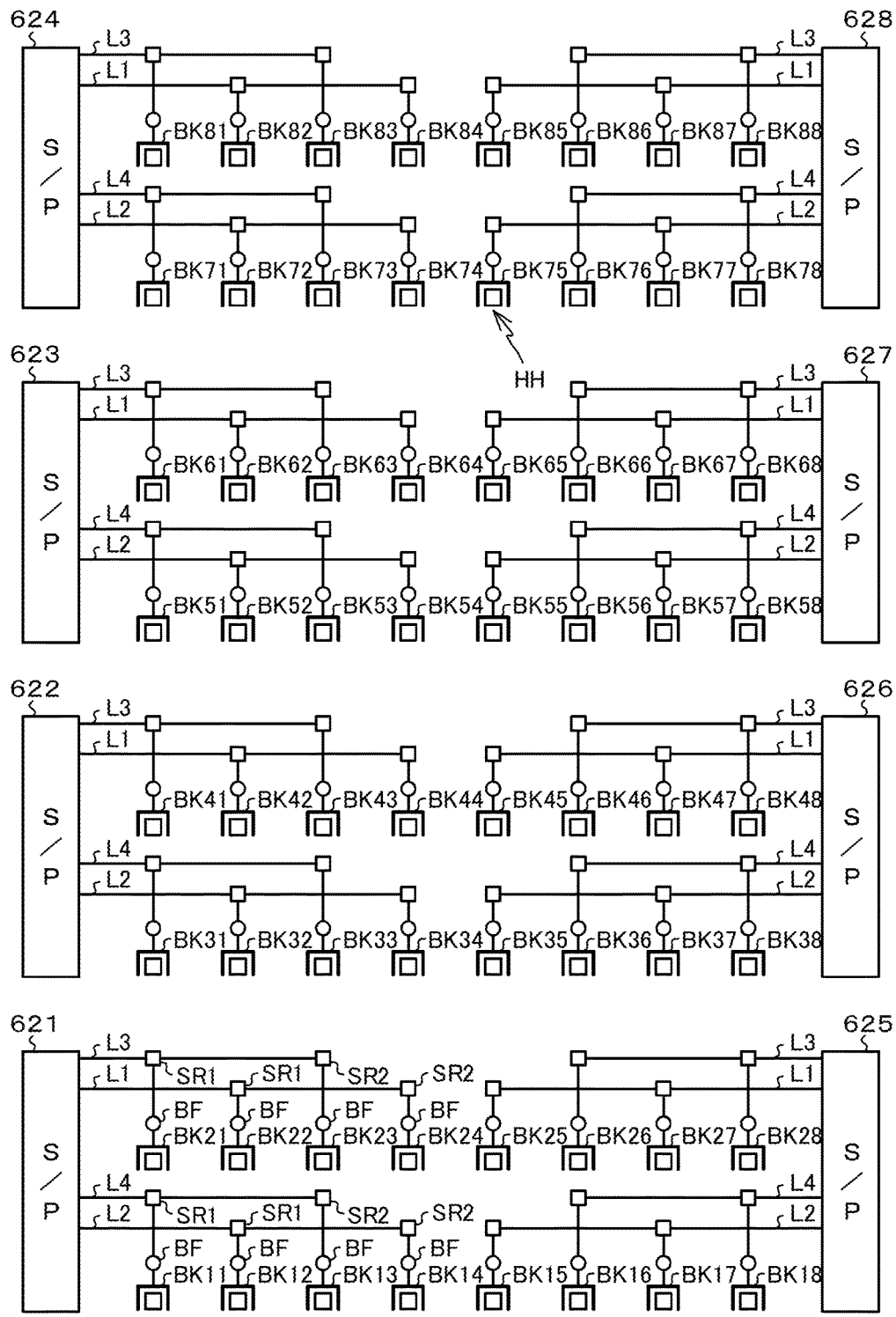
FIG. 6 is a wiring diagram illustrating a converter and a blanker.

FIG. 6 is a wiring diagram illustrating converters 621 to 628 and blankers BK11 to BK88. As shown in FIG. 6, in the aperture array 61, the electrodes 612 of the blankers BK11 to BK14 and BK21 to BK24 are connected to the converter 621 through the shift registers SR1 and SR2 and the buffer BF. Similarly, the electrodes 612 of the blankers BK31 to BK34 and BK41 to BK44 are connected to the converter 622. The electrodes 612 of the blankers BK51 to BK54 and BK61 to BK64 are connected to the converter 623. The electrodes 612 of the blankers BK71 to BK74 and BK81 to BK84 are connected to the converter 624. The electrodes 612 of the blankers BK15 to BK18 and BK25 to BK28 are connected to the converter 625. The electrodes 612 of the blankers BK35 to BK38 and BK45 to BK48 are connected to the converter 626. The electrodes 612 of the blankers BK55 to BK58 and BK65 to BK68 are connected to the converter 627. The electrodes 612 of the blankers BK75 to BK78 and BK85 to BK88 are connected to the converter 628.

The converters 621 to 628 are converters for converting serial data into parallel data. The converters 621 to 628 converts the serial data output from the control system 100 into parallel data including four data and outputs the four data. These data are output through four output lines L1 to L4. The operations of the converters 621 to 628 will be described below.

Returning to FIG. 1, the lens 42 is an annular electromagnetic lens and is disposed under the aperture array 61. The lens 42 makes the sixty four electron beams EBmn, that are parallelized with each other by passing through the aperture array 61 and travel downward, incident to the hole of the aperture 52.

The aperture 52 is a plate-shaped member provided with a center hole through which the electron beams EBmn pass. The aperture 52 is disposed in the vicinity of a convergence point (crossover point) of the electron beams EBmn passing through the lens 42. As each electron beam EBmn passes through the hole of the aperture 52, each electron beam EBmn is shaped in a shot shape. In addition, when the electron beams EBmn are deflected by the blanker BK of the aperture array 61, the electron beams EBmn are blanked by the aperture 52.

The deflector 62 is disposed under the aperture 52. The deflector 62 has a plurality of pairs of electrodes arranged to face each other. The deflector 62 deflects the electron beams EBmn passing through the aperture 52 depending on a voltage applied to the electrodes. In this embodiment, for simplicity purposes, only a single pair of electrodes separated by a predetermined distance in the X-axis direction are illustrated in the drawings, the deflector 62 may deflect the electron beams EBmn in the X-axis and Y-axis directions.

The lens 43 is an annular electromagnetic lens disposed to surround the deflector 62. The lens 43 focuses the electron beams EBmn on a desired position of the specimen 120 placed on the stage 70 in cooperation with the deflector 62.

The stage 70 is disposed inside the writing chamber 80a. The stage 70 is a stage capable of moving at least within the horizontal plane while the specimen 120 to be patterned is maintained nearly horizontally. On the upper surface of the stage 70, a mirror Mx whose longitudinal direction is set to the Y-axis direction and a mirror My whose longitudinal direction is set to the X-axis direction are provided. A position within the horizontal plane of the stage 70 is detected with respect to the mirrors Mx and My.

The control system 100 is a system for controlling the irradiator 20 and the stage 70. The control system 100 has a controller 101, a power source 102, a lens driver 103, a BAA controller 104, a deflection amplifier 105, and a stage driver 106.

Figure 7:
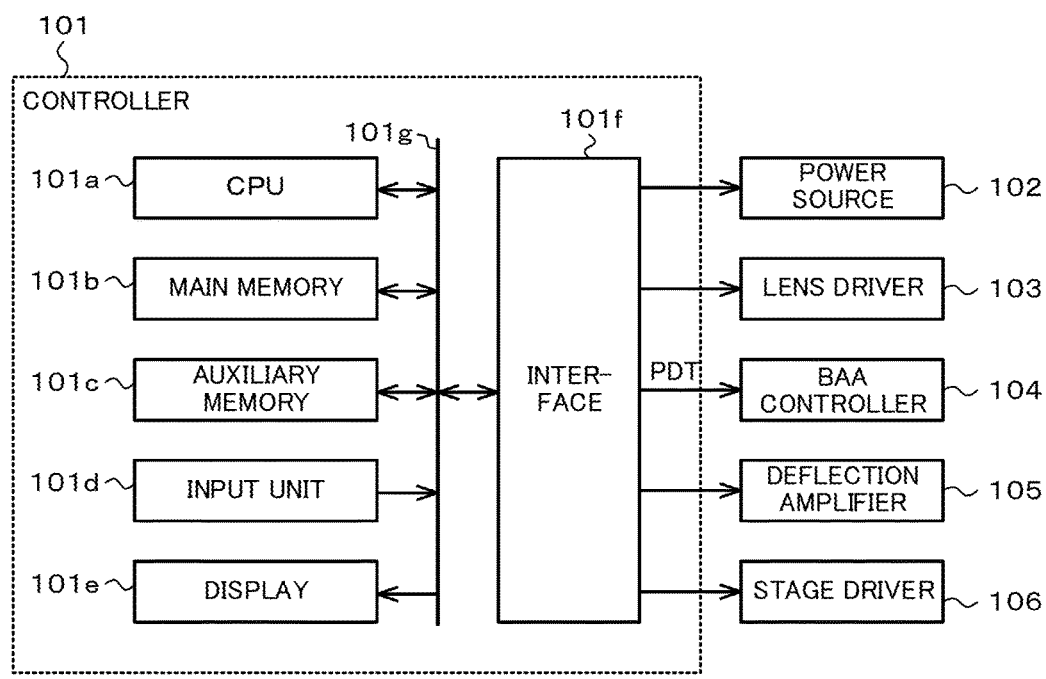
FIG. 7 is a block diagram illustrating a controller.

FIG. 7 is a block diagram illustrating the controller 101. As illustrated in FIG. 7, the controller 101 is a computer having a central processing unit (CPU) 101a, a main memory 101b, an auxiliary memory 101c, an input unit 101d, a display 101e, an interface 101f, and a system bus 101g used to connect these elements.

The CPU 101a reads a program stored in the auxiliary memory 101c and executes the program. In addition, the CPU 101a integrally controls the elements of the control system 100 on the basis of the program.

The main memory 101b has a volatile memory such as a random access memory (RAM). The main memory 101b is used as a work area of the CPU 101a.

The auxiliary memory 101c has a non-volatile memory such as a read-only memory (ROM), a magnetic disc, and a semiconductor memory. The auxiliary memory 101c stores a program executed by the CPU 101a, image data PDT representing a pattern to be drawn on the specimen 120, various parameters, and the like.

The input unit 101d has a pointing device such as a keyboard or a mouse. A user's instruction is input through the input unit 101d and is notified to the CPU 101a via the system bus 101g.

The display 10le has a display device such as a liquid crystal display (LCD). The display 101e displays information regarding a status of the electron beam lithography apparatus 10, a lithographic pattern PDT, and the like.

The interface 101f has a LAN interface, a serial interface, a parallel interface, an analog interface, and the like. The power source 102, the lens driver 103, the BAA controller 104, the deflection amplifier 105, and the stage driver 106 are connected to the controller 101 through the interface 101f.

The controller 101 configured as described above integrally controls the power source 102, the lens driver 103, the BAA controller 104, the deflection amplifier 105, and the stage driver 106.

Returning to FIG. 1, the power source 102 applies a voltage to the electron gun 30 in response to an instruction from the controller 101. As a result, the electron beam EB is ejected from the electron gun 30 downward.

The lens driver 103 controls (refractive) power of the lens 41 for the electron beam EB on the basis of the instruction from the controller 101 such that the electron beam EB spreading downward is shaped into an electron beam traveling in parallel to the vertical direction. In addition, the lens driver 103 controls power of the lens 42 such that the electron beams EBmn are converged into the center of the aperture 52. Furthermore, the lens driver 103 controls power of the lens 43 such that the electron beams EBmn are focused on the upper surface of the specimen 120.

Figure 8:
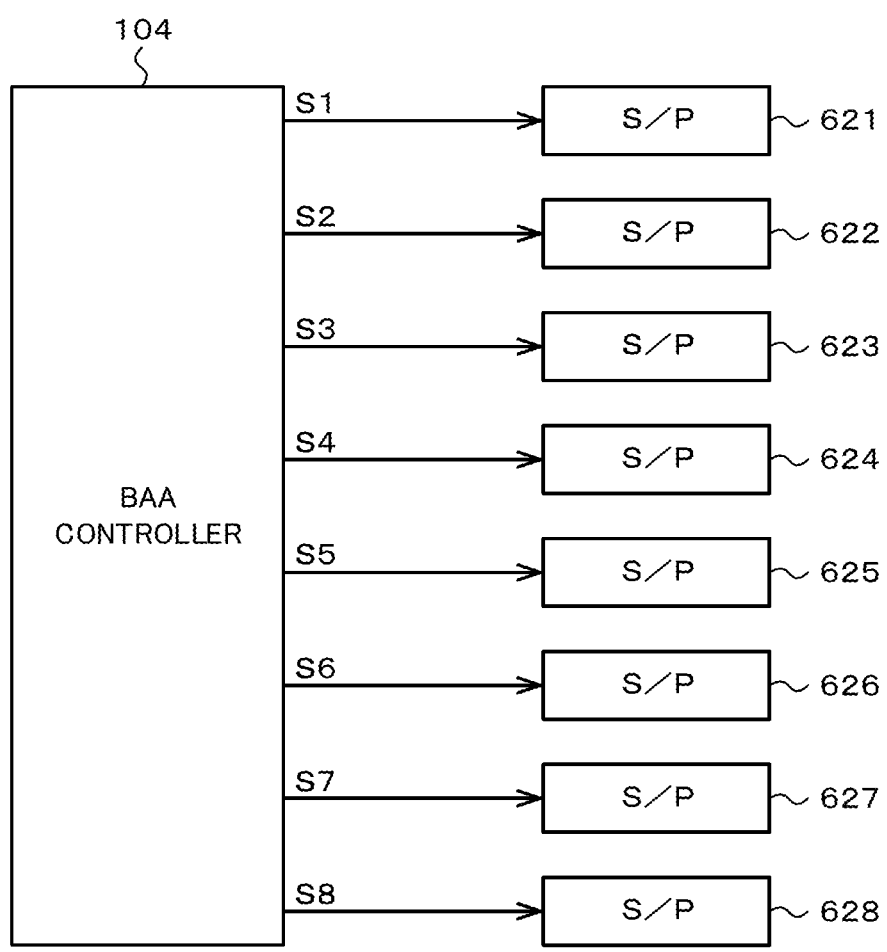
FIG. 8 is a connection diagram illustrating a BAA controller and the converter.

Similar to the controller 101, the BAA controller 104 is a computer having a CPU. The converters 621 to 628 are connected to the BAA controller 104 as illustrated in FIG. 8. The BAA controller 104 creates serial data S1 to S8 on the basis of the image data PDT transmitted from the controller 101. In addition, the BAA controller 104 outputs the serial data S1 to S8 to the converters 621 to 628. The operation of the BAA controller 104 will be described below.

Returning to FIG. 1, the deflection amplifier 105 generates a voltage signal on the basis of an instruction from the controller 101 and outputs the voltage signal to the electrodes of the deflector 62. As a result, a voltage difference is generated between the electrodes of the deflector 62. The electron beams EBmn passing through the deflector 62 are deflected as much as the voltage difference.

The stage driver 106 measures positions of the mirrors Mx and My of the stage 70 using a laser sensor (not shown) and the like and detects a position of the stage 70 on the basis of the measurement result. In addition, the stage driver 106 drives the stage 70 on the basis of an instruction from the controller 101 to move or position the specimen 120.

<Operation of Apparatus>

In the electron beam lithography apparatus 10 described above, the controller 101 integrally controls the power source 102, the lens driver 103, the BAA controller 104, the deflection amplifier 105, and the stage driver 106. For example, if the pattern is drawn on the specimen 120 using the electron beam lithography apparatus 10, the CPU 101a of the controller 101 drives the stage 70 where the specimen 120 is placed in order to position the specimen 120 under the irradiator 20.

The CPU 101a drives the power source 102 to apply a voltage to the electron gun 30. As a result, the electron beam EB is ejected from the electron gun 30.

As the electron beam EB is ejected from the electron gun 30, the CPU 101a controls the lens 41 using the lens driver 103 to shape the electron beam EB spreading downward so as to be parallel to the vertical axis.

The electron beam EB shaped by the lens 41 travels downward and passes through the aperture 51. As a result, the electron beam EB is branched into a plurality of (sixty four) electron beams EBmn. The electron beams EBmn pass through the blankers BKmn of the aperture array 61 and travel through holes HHmn of the substrate 610 included in the aperture array 61.

The CPU 101a controls the lens 42 using the lens driver 103 such that each of the electron beams EBmn passing through the aperture array 61 is converged in the vicinity of the hole of the aperture 52.

As each of the electron beams EBmn passes through the hole of the aperture 52, an outer diameter and a shape of the shot are shaped. The electron beams EBmn passing through the aperture 52 are incident to the lens 43.

The CPU 101a controls the lens 43 using the lens driver 103 such that the electron beams EBmn incident to the lens 43 are focused on the surface of the specimen 120 held by the stage 70. In addition, the CPU 101a controls an incident position of the electron beam EBmn to the specimen 120 by deflecting the electron beams EBmn in the X-axis or Y-axis direction using the deflection amplifier 105.

In addition to the aforementioned operation, the CPU 101a outputs the image data PDT to the BAA controller 104. The ON/OFF control of the electron beams EBmn incident to the specimen 120 is performed on the basis of the image data PDT.

Figure 9:
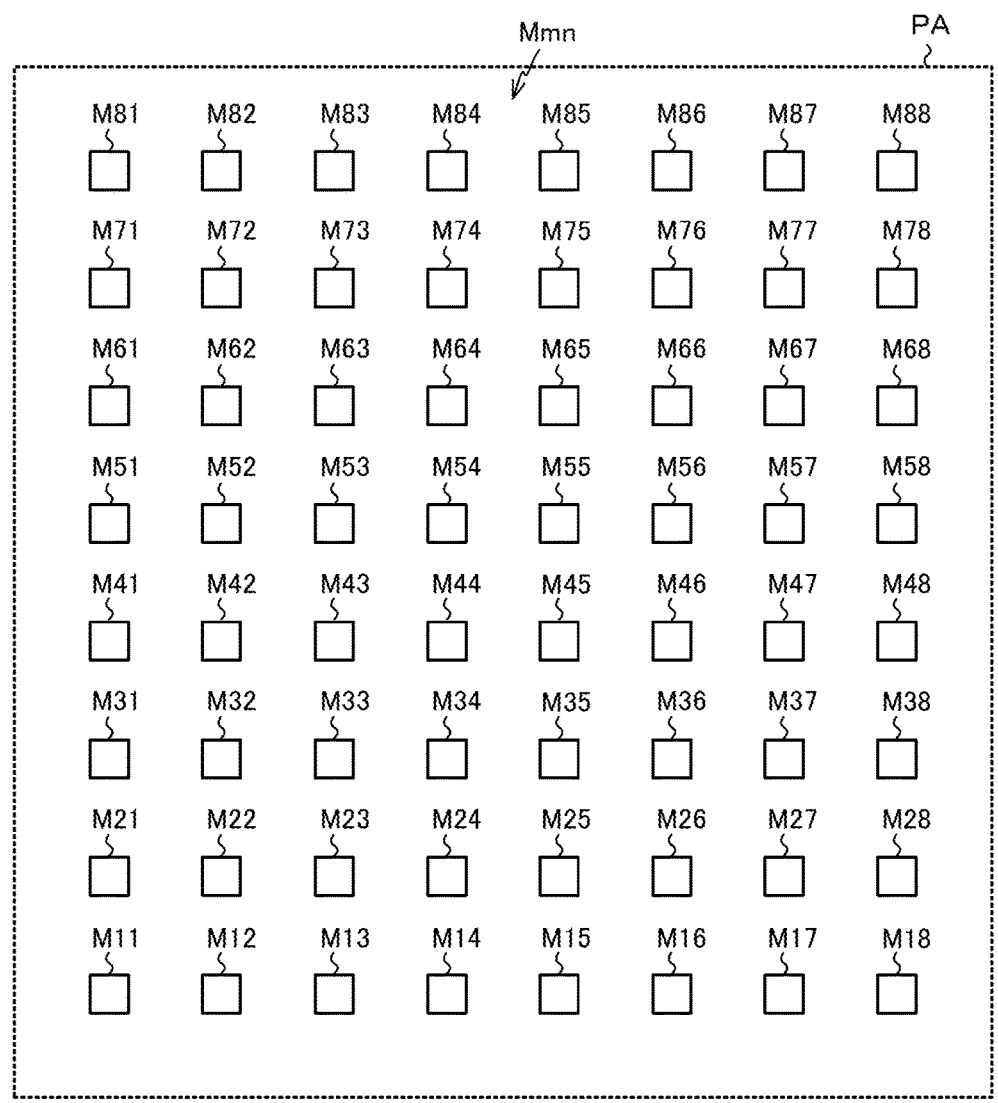
FIG. 9 is a diagram illustrating a unit pattern drawn on the basis of image data.

FIG. 9 is a diagram illustrating a unit pattern PA drawn on the basis of the image data PDT by way of example. The unit pattern PA includes sixty four marks Mmn drawn by the sixty four electron beams EBmn. The electron beam lithography apparatus 10 draws a circuit pattern CPA including the unit pattern PA on the specimen 120 by sequentially drawing the unit pattern PA on the upper surface of the specimen 120 as indicated by the arrow in FIG. 10.

Figure 11:
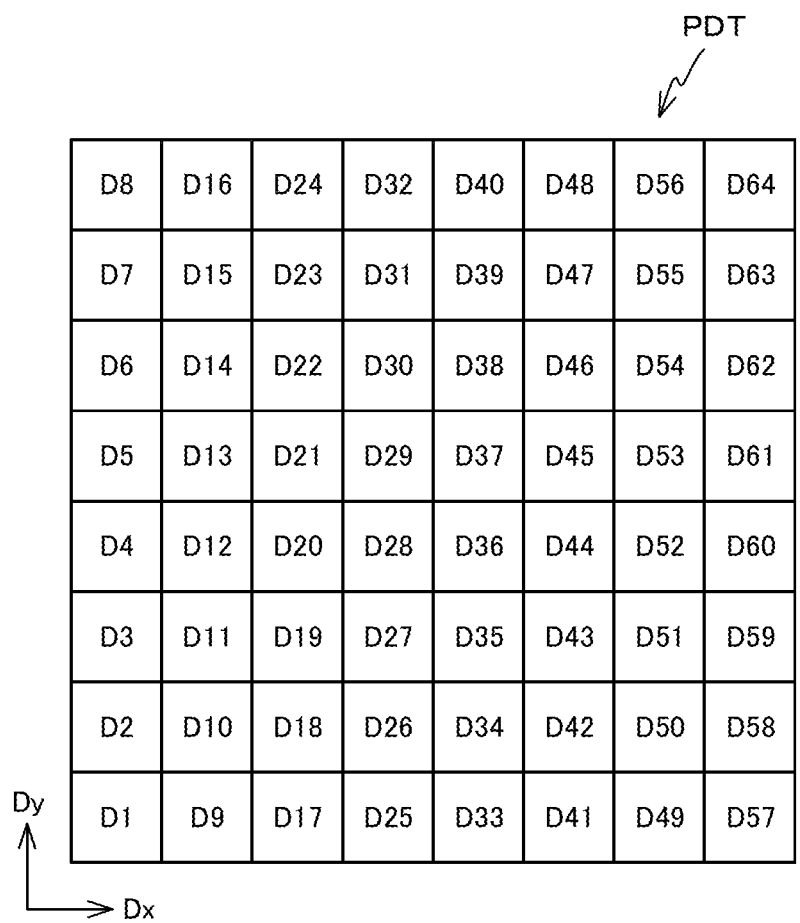
FIG. 11 is a schematic diagram illustrating the image data.

FIG. 11 is a schematic diagram illustrating the image data PDT as an example. As illustrated in FIG. 11, the image data PDT includes unit data D1 to D64 representing doses of the electron beams for drawing the sixty four marks Mmn. For example, the image data PDT is bitmap data in which the unit data D1 to D64 are arranged in an eight-row and eight-column matrix shape in the Dy-axis and Dx-axis directions. The image data PDT is stored in the auxiliary memory 101c of the controller 101 in advance. In addition, when the drawing on the specimen 120 starts, the image data is output to the BAA controller 104.

The BAA controller 104 creates the serial data S1 to S8 on the basis of the image data PDT.

Figure 12:
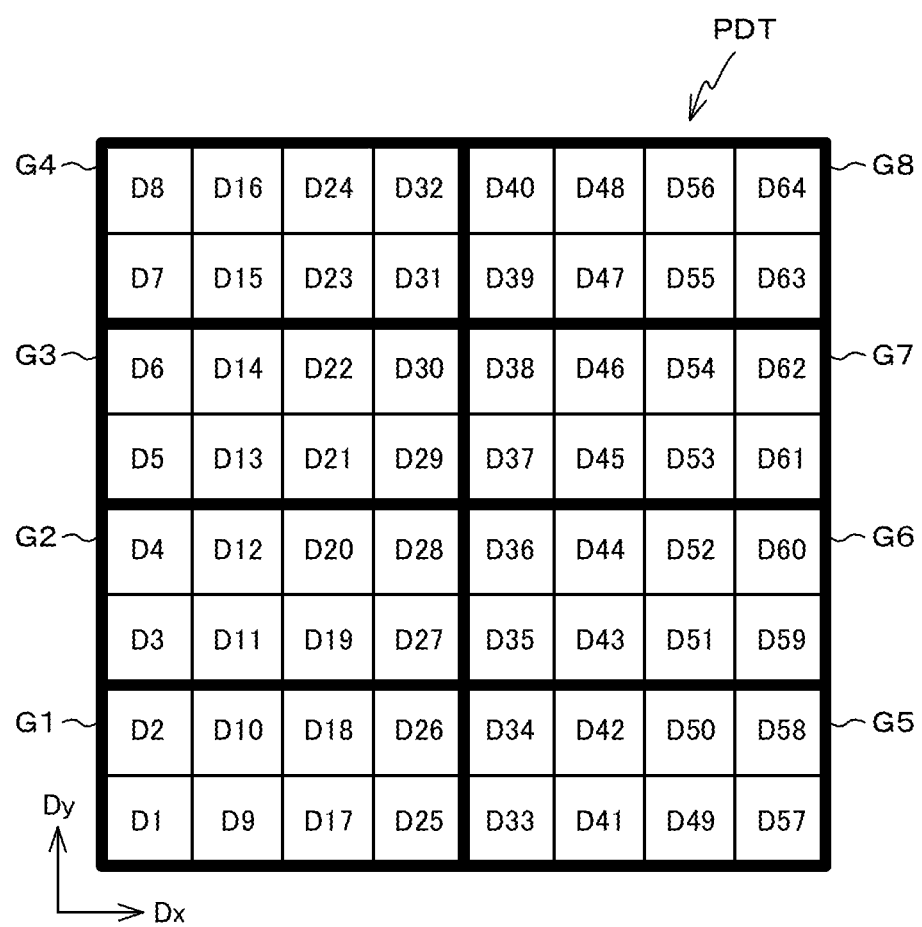
FIG. 12 is a diagram for describing a drawing process of the circuit pattern.

Specifically, the BAA controller 104 divides the unit data D1 to D64 of the image data PDT into eight data groups G1 to G8 as illustrated in FIG. 12. As shown in FIGS. 4, 6, and 12, the unit data of the data group G1 correspond to the blankers BK11 to BK14 and BK21 to BK24. The unit data of the data group G2 correspond to the blankers BK31 to BK34 and BK41 to BK44. The unit data of the data group G3 correspond to the blankers BK51 to BK54 and BK61 to BK64. The unit data of the data group G4 correspond to the blankers BK71 to BK74 and BK81 to BK84. The unit data of the data group G5 correspond to the blankers BK15 to BK18 and BK25 to BK28. The unit data of the data group G6 correspond to the blankers BK35 to BK38 and BK45 to BK48. The unit data of the data group G7 correspond to the blankers BK55 to BK58 and BK65 to BK68. The unit data of the data group G8 correspond to the blankers BK75 to BK78 and BK85 to BK88.

The BAA controller 104 divides the unit data of the data groups G1 to G8 into blocks of the unit data whose number is equivalent to the number of data output from the converters 621 to 628 in parallel. As illustrated in FIG. 6, the converters 621 to 628 has four output lines L1 to L4. The BAA controller 104 divides the unit data of each data group G1 to G8 into four-row and four-column blocks of the unit data.

Figure 13:
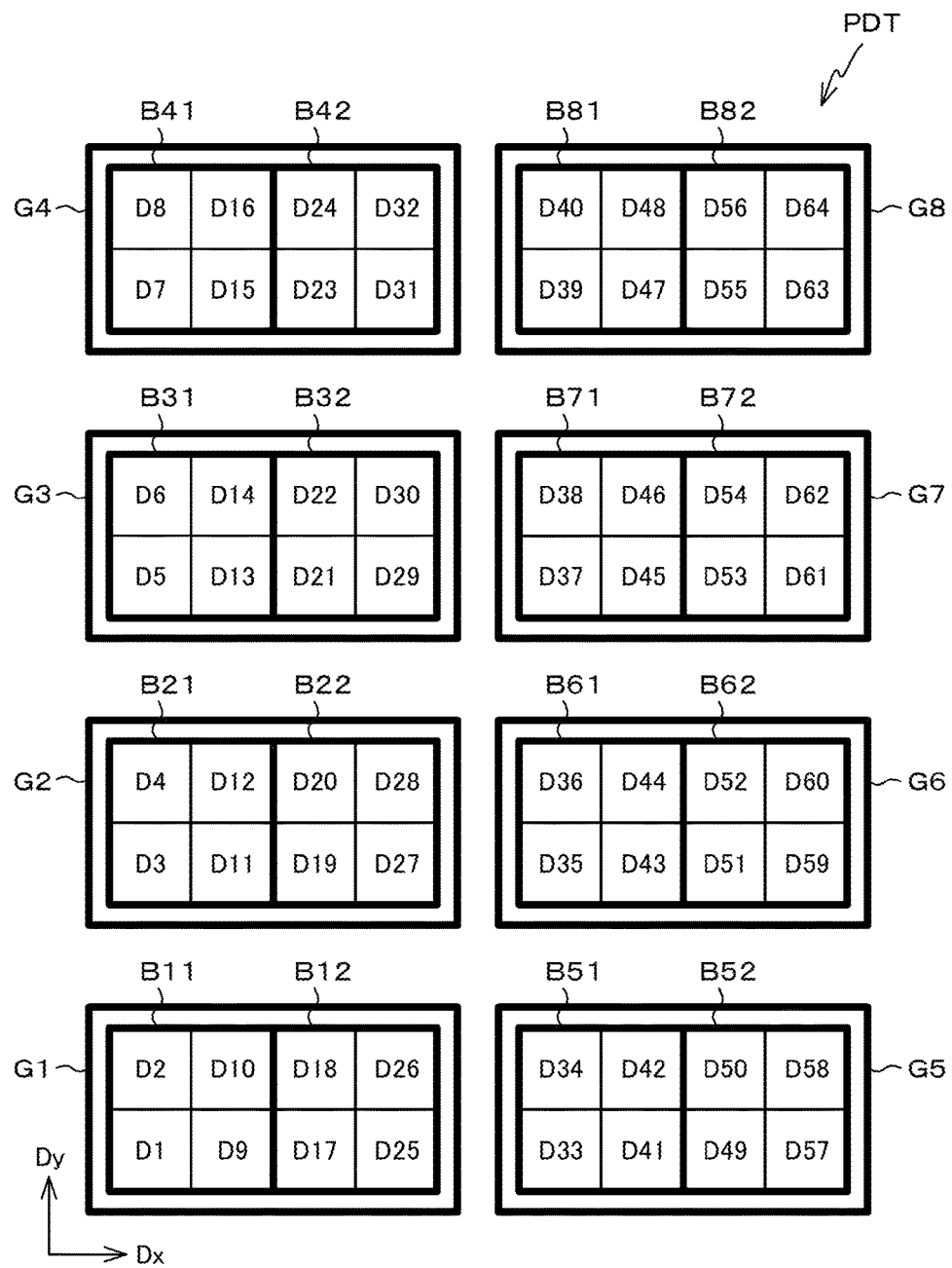
FIG. 13 is a diagram for describing a drawing process of the circuit pattern.

For example, as illustrated in FIG. 13, the BAA controller 104 divides the unit data of the data group G1 into a block B11 including the unit data D1, D2, D9, and D10 and a block B12 including the unit data D17, D18, D25, and D26.

Similarly, the BAA controller 104 divides the unit data of each data group G2 to G8 into blocks B21 to B81 and blocks B22 to B82.

The block B21 of the data group G2 includes the unit data D3, D4, D11, and D12, and the block B22 includes the unit data D19, D20, D27, and D28. The block B31 of the data group G3 includes the unit data D5, D6, D13, and D14, and the block B32 includes the unit data D21, D22, D29, and D30. The block B41 of the data group G4 includes the unit data D7, D8, D15, and D16, and the block B42 includes the unit data D23, D24, D31, and D32. The block B51 of the data group G5 includes the unit data D33, D34, D41, and D42, and the block B52 includes the unit data D49, D50, D57, and D58. The block B61 of the data group G6 includes the unit data D35, D36, D43, and D44, and the block B62 includes the unit data D51, D52, D59, and D60. The block B71 of the data group G7 includes the unit data D37, D38, D45, and D46, and the block B72 includes the unit data D53, D54, D61, and D62. The block BS81 of the data group G8 includes the unit data D39, D40, D47, and D48, and the block B82 includes the unit data D55, D56, D63, and D64.

Figure 14:
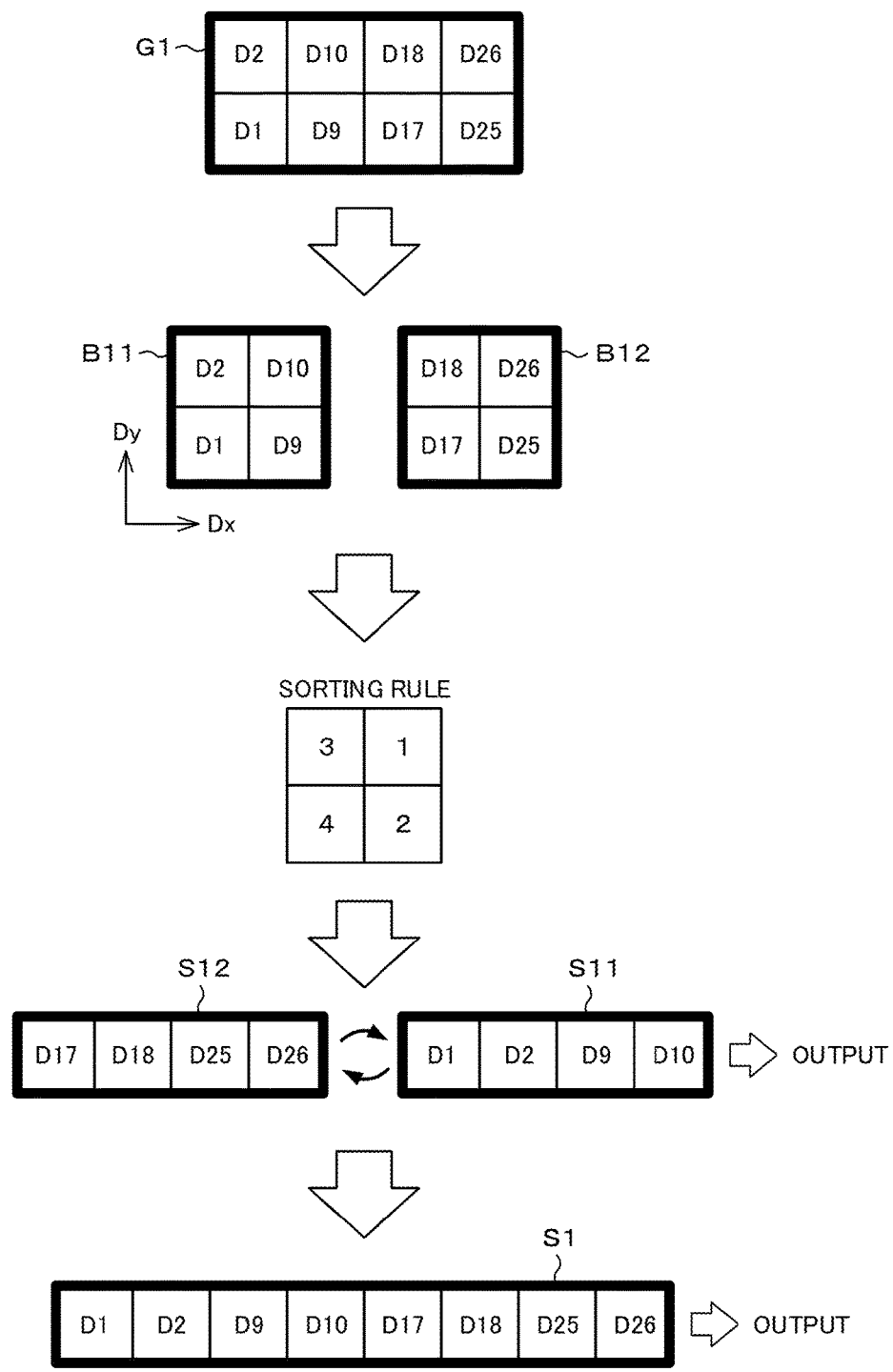
FIG. 14 is a diagram for describing a drawing process of the circuit pattern.

The BAA controller 104 sorts the unit data of the block B11 of the data group G1 and the unit data of the block B12 of the data group G1 according to a predetermined rule. FIG. 14 is a schematic diagram illustrating a process of generating the serial data S1 from the data group G1. The BAA controller 104 divides the data group G1 into blocks B11 and B12 as illustrated in FIG. 14 and sorts the unit data of the blocks B11 and B12 according to the sorting rule of FIG. 14.

The sorting rule is defined on the basis of a relationship between the converter 621 where the unit data D1, D2, D9, D10, D17, D18, D25, and D26 of the block B11 are output and the blankers BK11 to BK14 and BK21 to BK24. For example, as illustrated by FIG. 6, if the converter 621 firstly outputs the unit data D10 to the output line L1 for the blanker BK22, secondly outputs the unit data D9 to the output line L2 for the blanker BK12, thirdly outputs the unit data D2 to the output line L3 for the blanker BK21, and fourthly outputs the unit data D1 to the output line L4 for the blanker BK11, the BAA controller 104 creates serial data S11 [D10, D9, D2, D1] having the unit data D10 as a head by sorting the unit data D1, D2, D9, and D10.

Similarly, the BAA controller 104 creates serial data S12 [D26, D25, D18, D17] having the unit data D26 as a head by sorting the unit data D17, D18, D25, and D26 of the block B12.

As illustrated by FIG. 6, in the output lines L1 to L4 of the converter 621, the blankers BK13, BK23, BK14, and BK24 corresponding to the unit data D17, D18, D25, and D26 are placed in the downstream of the blankers BK11, BK21, BK12, and BK22 corresponding to the unit data D1, D2, D9, and D10. In this regard, the BAA controller 104 exchanges the sequences of the serial data S12 and S11 with each other and combines the exchanged sequences as illustrated in FIG. 14 so as to create serial data S1 [D26, D25, D18, D17, D10, D9, D2, D1] having the unit data D26 as a head. In this manner, the image data PDT is converted to create serial data S1 suitable for the format of the converter 621. The BAA controller 104 outputs the serial data S1 to the converter 621.

Figure 15:
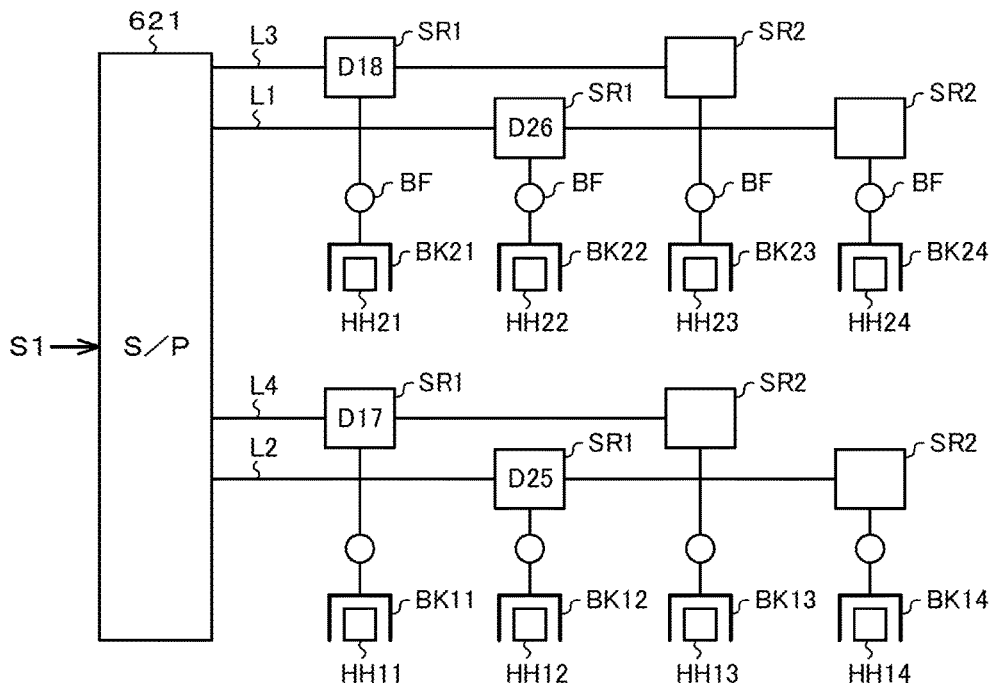
FIG. 15 is a diagram for describing a drawing process of the circuit pattern.
Figure 16:
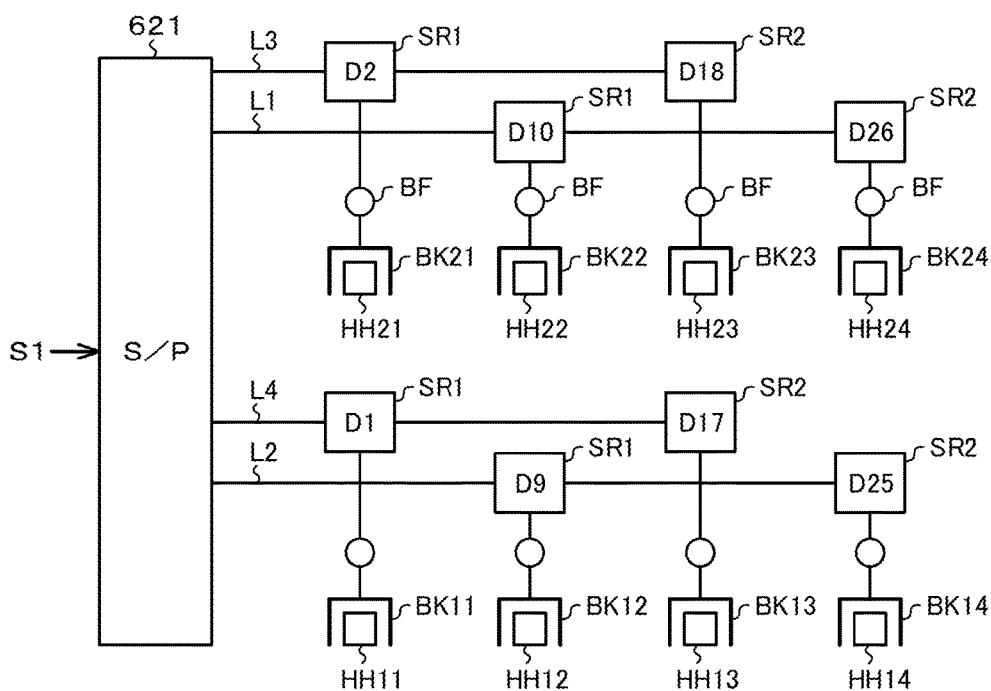
FIG. 16 is a diagram for describing a drawing process of the circuit pattern.

As the serial data S is output to the converter 621, unit data of the serial data S1 are sequentially output from the output lines L1 to L4. As the unit data D26, D25, D18, and D17 of the serial data S1 are sequentially output, the unit data D26, D25, D18, and D17 are stored in the shift register SR1 of the output lines L1 to L4 as illustrated in FIG. 15. Subsequently, when the unit data D10, D9, D2, and D1 are sequentially output, the unit data D26, D25, D18, and D17 are sent to the shift register SR2 of the output lines L1 to L4 and are stored therein as illustrated in FIG. 16. In addition, the unit data D10, D9, D2, and D1 are stored in the shift register SR1 of the output lines L1 to L4.

Figure 17:
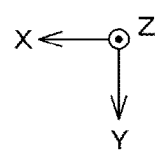
FIG. 17 is a diagram for describing a drawing process of the circuit pattern.

If the unit data D1, D9, D17, D25, D2, D10, D18, and D26 are stored in both the shift registers SR1 and SR2 of the output lines L1 to L4, each of the unit data is output to the blankers BK11, BK12, BK13, BK14, BK21, BK22, BK23, and BK24 through the buffer BF. As a result, a dose of the electron beams EBmn passing through the holes HH11, HH12, HH13, HH14, HH21, HH22, HH23, and HH24 is controlled on the basis of the values of the unit data. Consequently, as illustrated in FIG. 17, the marks M11 to M14 and M21 to M24 of the unit pattern PA are drawn with a predetermined dose.

The BAA controller 104 also creates serial data S2 to S4 from the unit data of the data groups G2 to G4 and outputs them to the converters 622, 623, and 624. As a result, the marks Mm1 to Mm4 are drawn in the left half area of the unit pattern PA of FIG. 9.

Figure 18:
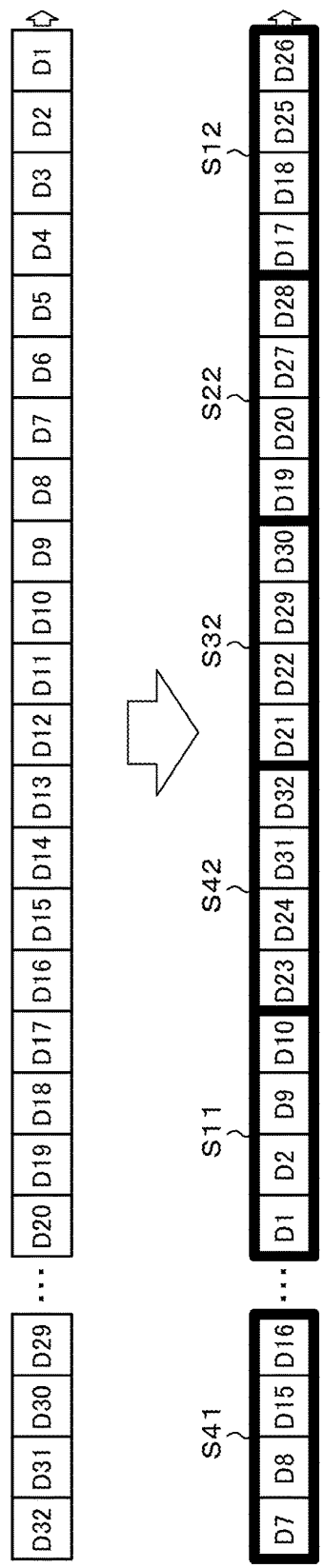
FIG. 18 is a schematic diagram illustrating serial data based on image data.

FIG. 18 is a schematic diagram illustrating serial data obtained by arranging the unit data D1 to D32 on the basis of the arrangement rank of the image data PDT and serial data obtained by arranging the unit data D1 to D32 on the basis of the sorting rule. Through the process described above, the unit data D1 to D32 are converted from the serial data having the unit data D1 as a head and the unit data D32 as a tail into the serial data S11, S12, S21, S22, S31, S32, S41, and S42. In addition, the converted serial data are sequentially output one by one to the lines L1 to L4 of the converters 621 to 624 of FIG. 6. As a result, the serial data S1 to S4 are output to the converters 621 to 624, respectively.

Figure 19:
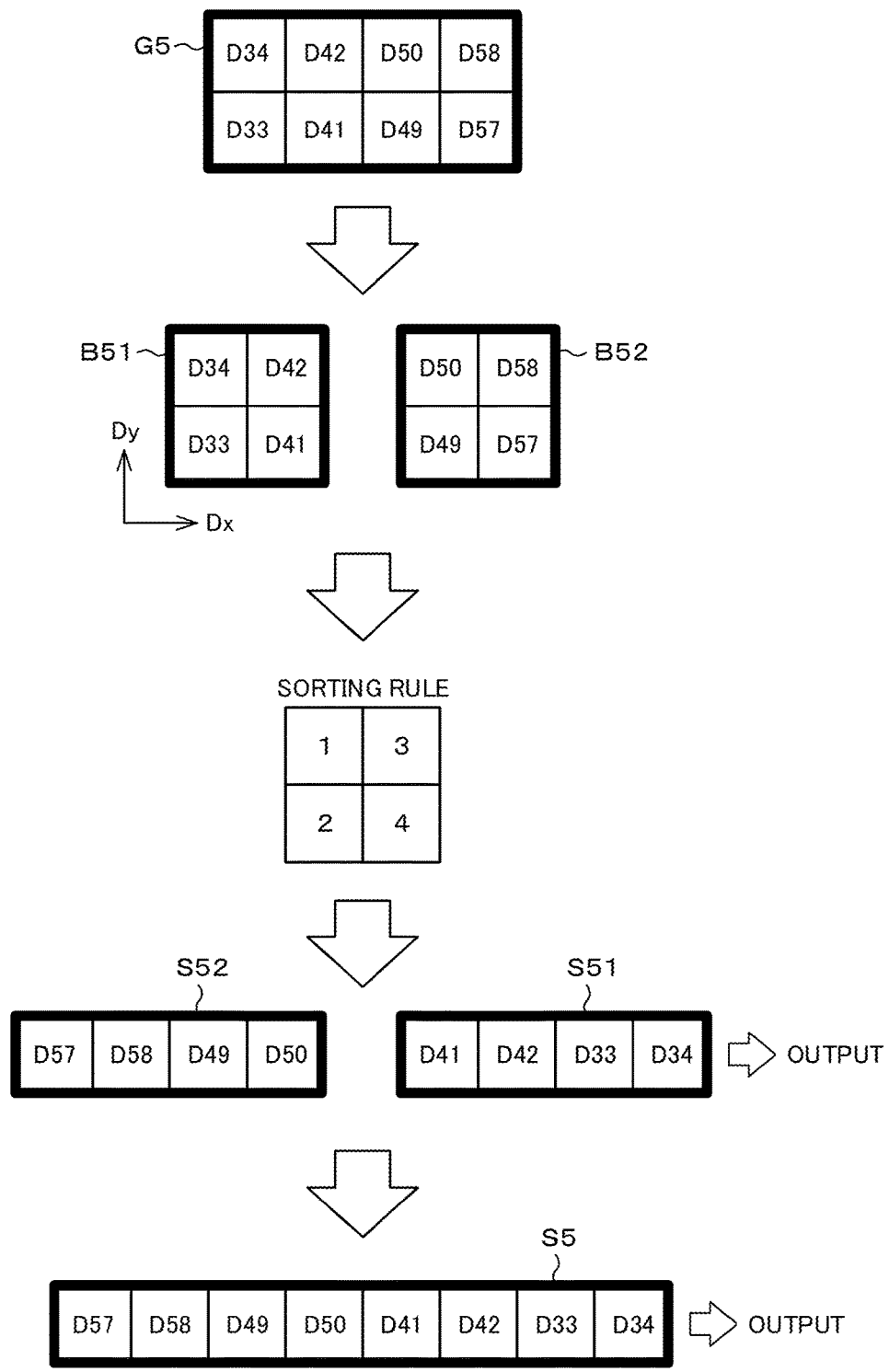
FIG. 19 is a diagram for describing a drawing process of the circuit pattern.

Similarly, the BAA controller 104 sorts the unit data of the block B51 of the data group G5 and the unit data of the block B52 of the data group G5 on the basis of a predetermined rule. FIG. 19 is a schematic diagram illustrating a process of creating serial data S5 from the data group G5. The BAA controller 104 divides the data group G5 into the blocks B51 and B52 as illustrated in FIG. 19. Then, the BAA controller 104 sorts the unit data of the blocks B51 and B52 on the basis of the sorting rule illustrated in FIG. 19.

The sorting rule is defined by a relationship between the converter 625 and the blankers BK15 to BK18 and BK25 to BK28. The unit data D33, D34, D41, D42, D49, D50, D57, and D58 of the block B51 are output to the converter 625. The BAA controller 104 creates the serial data S51 [D34, D33, D42, D41] having the unit data D34 as a head by sorting the unit data D33, D34, D41, and D42.

Similarly, the BAA controller 104 creates serial data S52 [D50, D49, D58, D57] having the unit data D50 as a head by sorting the unit data D49, D50, D57, and D58 of the block B52.

As illustrated by FIG. 6, in the output lines L1 to L4 of the converter 625, the blankers BK15, BK25, BK16, and BK26 corresponding to the unit data D33, D34, D41, and D42 are placed in the downstream of the blankers BK17, BK27, BK18, and BK28 corresponding to the unit data D49, D50, D57, and D58. In this case, the BAA controller 104 combines the serial data S51 and S52 without exchanging their sequences as illustrated in FIG. 19 to create serial data S5 [D34, D33, D42, D41, D50, D49, D58, D57] having the unit data D34 as a head. In this manner, serial data S5 suitable for the format of the converter 625 is created by converting the image data PDT. The BAA controller 104 outputs the serial data S5 to the converter 625.

Figure 20:
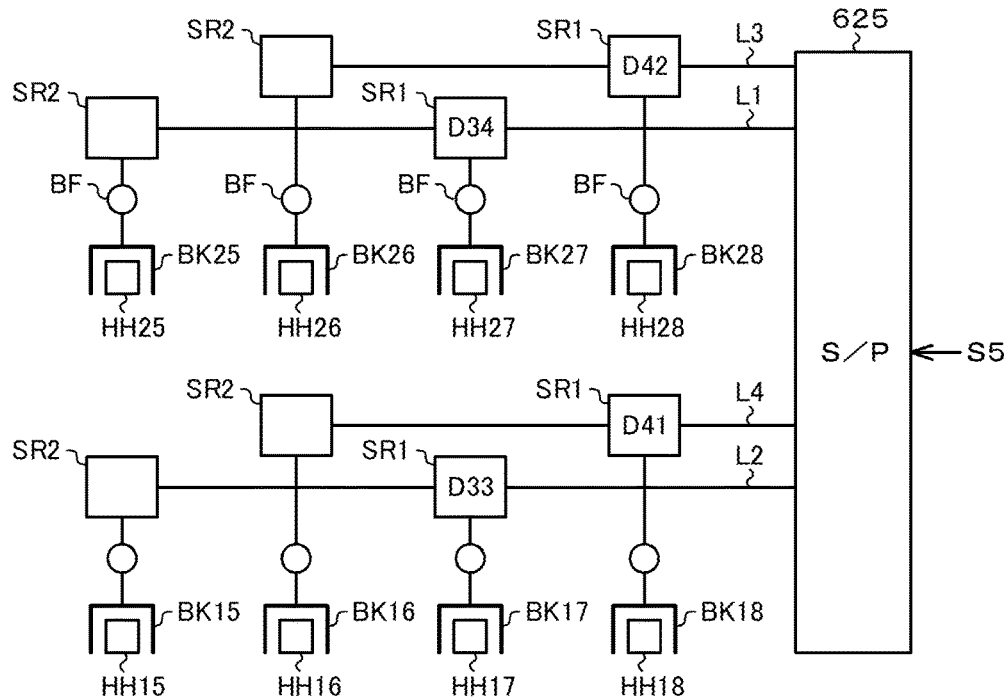
FIG. 20 is a diagram for describing a drawing process of the circuit pattern.
Figure 21:
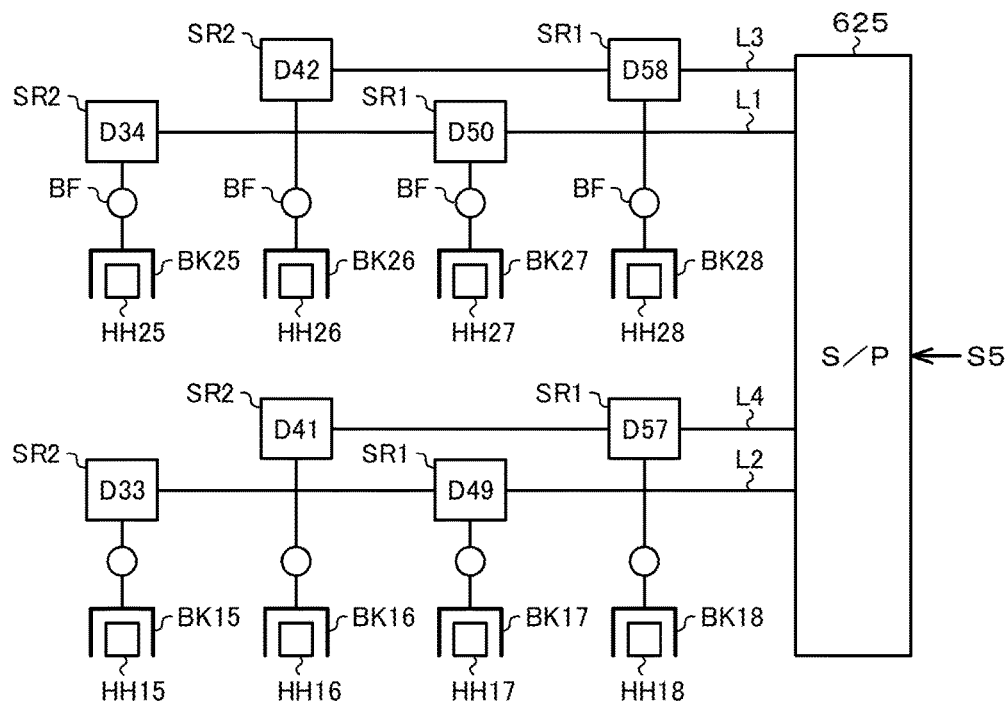
FIG. 21 is a diagram for describing a drawing process of the circuit pattern.

When the serial data S5 is output to the converter 625, the unit data of the serial data S5 are sequentially output from the output lines L1 to L4. When the unit data D34, D33, D42, and D41 of the serial data S5 are sequentially output, the unit data D34, D33, D42, and D41 are stored in the shift register SR1 of the output lines L1 to L4 as illustrated in FIG. 20. Subsequently, When the unit data D50, D49, D58, and D57 are sequentially output, the unit data D34, D33, D42, and D41 are sent to the shift register SR2 of the output lines L1 to L4 and are stored therein as illustrated in FIG. 21. In addition, the unit data D50, D49, D58, and D57 are stored in the shift register SR1 of the output lines L1 to L4.

If the unit data D33, D41, D49, D57, D34, D42, D50, and D58 are stored in both the shift registers SR1 and SR2 of the output lines L1 to L4, the unit data are output to the blankers BK15, BK16, BK17, BK18, BK25, BK26, BK27, and BK28, respectively, through the buffer BF. As a result, a dose of the electron beams EBmn passing through the holes HH15, HH16, HH17, HH18, HH25, HH26, HH27, and HH28 is controlled on the basis of the value of the unit data. Consequently, as illustrated in FIG. 22, the marks M15 to M18 and M25 to M28 of the unit pattern PA are drawn with a predetermined dose.

The BAA controller 104 also creates the serial data S6 to S8 from the unit data of the data groups G6 to G8 and outputs the serial data S6 to S8 to the converters 626, 627, and 628. As a result, the marks Mm5 to Mm8 are drawn in the right half area of the unit pattern PA of FIG. 9, so that the drawing of the unit pattern PA is completed.

Figure 23:
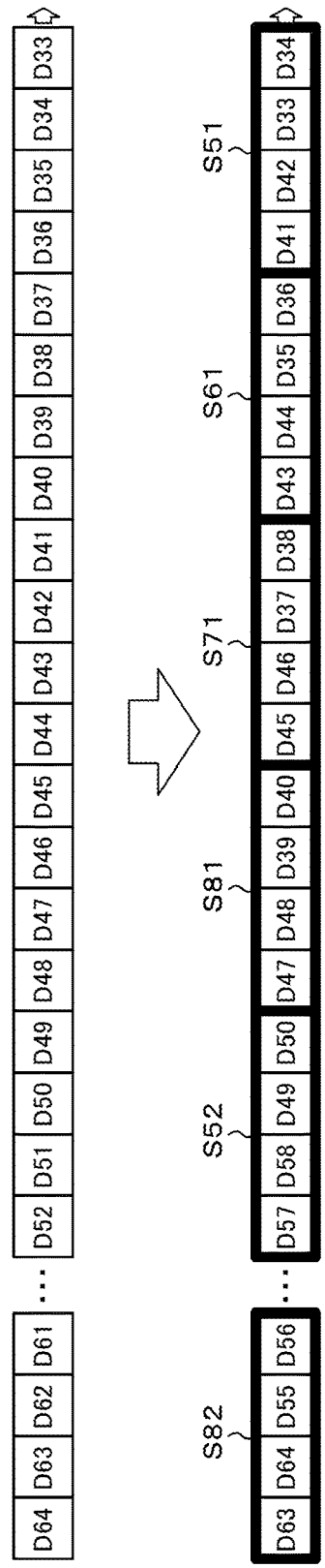
FIG. 23 is a schematic diagram illustrating serial data based on image data.

FIG. 23 is a schematic diagram illustrating serial data obtained by arranging the unit data D33 to D64 on the basis of the arrangement rank of the image data PDT and serial data obtained by arranging the unit data D33 to D64 on the basis of a sorting rule. In the process described above, the unit data D33 to D64 are converted from the serial data having the unit data D33 as a head and the unit data D64 as a tail into the serial data S51, S52, S61, S62, S71, S72, S81, and S82. In addition, the converted serial data are sequentially output one by one to the lines L1 to L4 of the converters 625 to 628 of FIG. 6. As a result, the serial data S5 to S8 are output to the converters 625 to 628, respectively.

Figure 10:
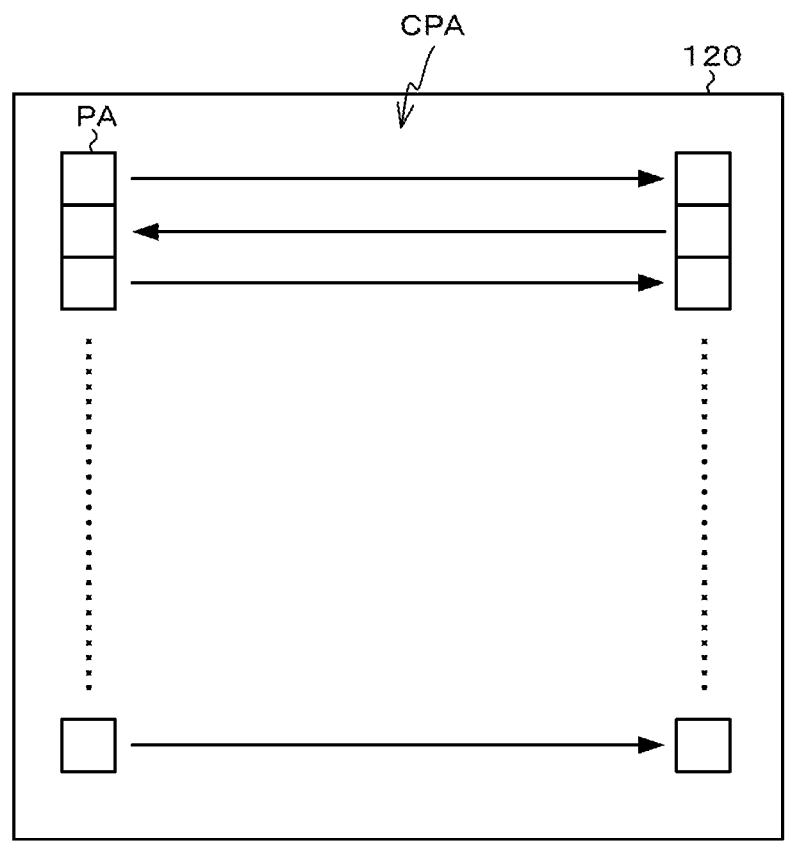
FIG. 10 is a diagram illustrating a circuit pattern including the unit pattern.

The electron beam lithography apparatus 10 consecutively draws the unit pattern PA on the upper surface of the specimen 120 as illustrated in FIG. 10 on the basis of the aforementioned method to finally obtain the circuit pattern CPA.

In the electron beam lithography apparatus 10, the unit data of the image data PDT are sorted as described above. When the unit data are sorted, a sorting error may occur, for example, if the number of the unit data of the image data PDT is too large. In this regard, in the electron beam lithography apparatus 10, a sorting error is diagnosed using a checksum. An error diagnosis process for diagnosing a sorting error will be described below with reference to FIG. 24.

<Diagnosis Process>

Figure 24:
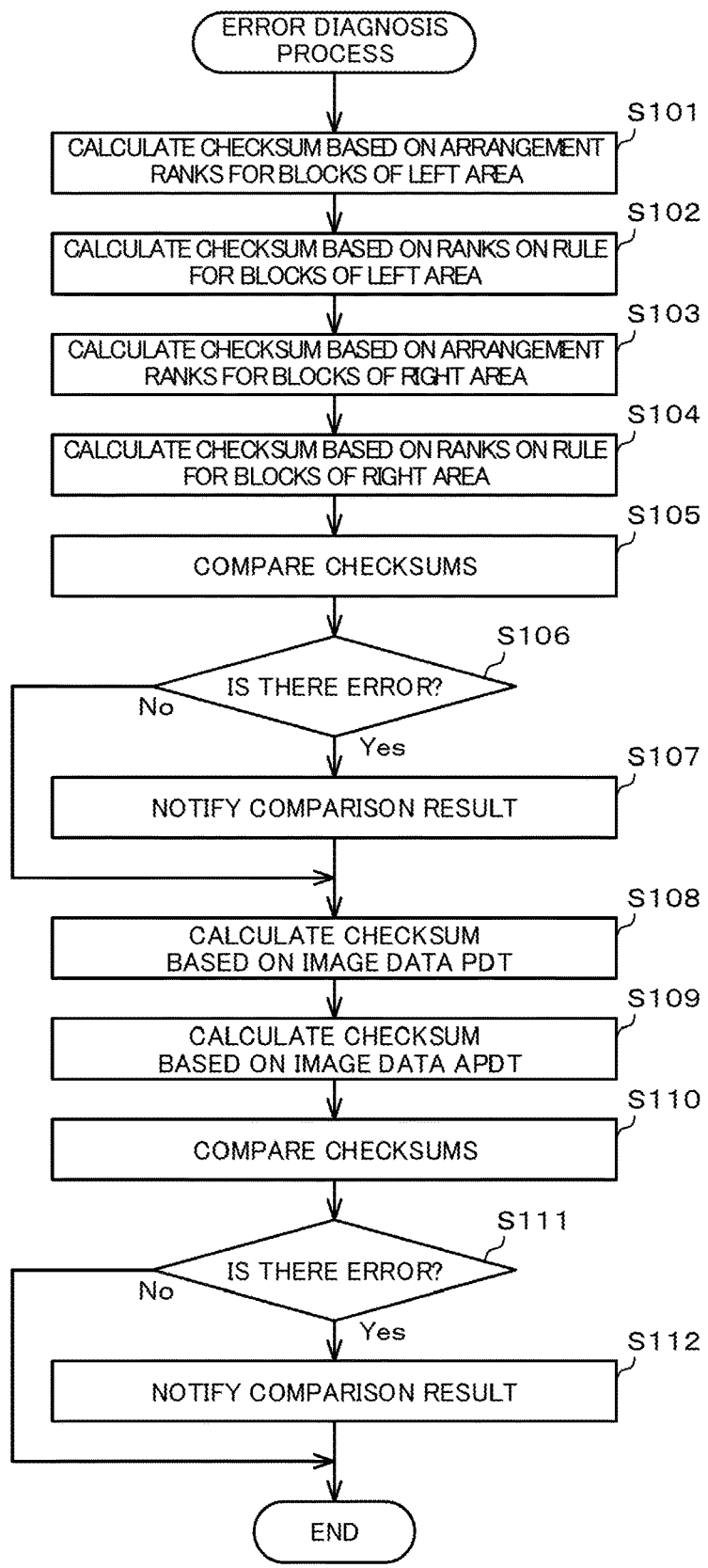
FIG. 24 is a flowchart illustrating an error diagnosis process.

FIG. 24 is a flowchart illustrating an error diagnosis process. A series of processes of FIG. 24 are executed by the BAA controller 104.

The BAA controller 104 calculates a checksum for each arrangement rank of the unit data of each block of the data groups G1 to G4 in the left area of the image data PDT (step S101).

Figure 25:
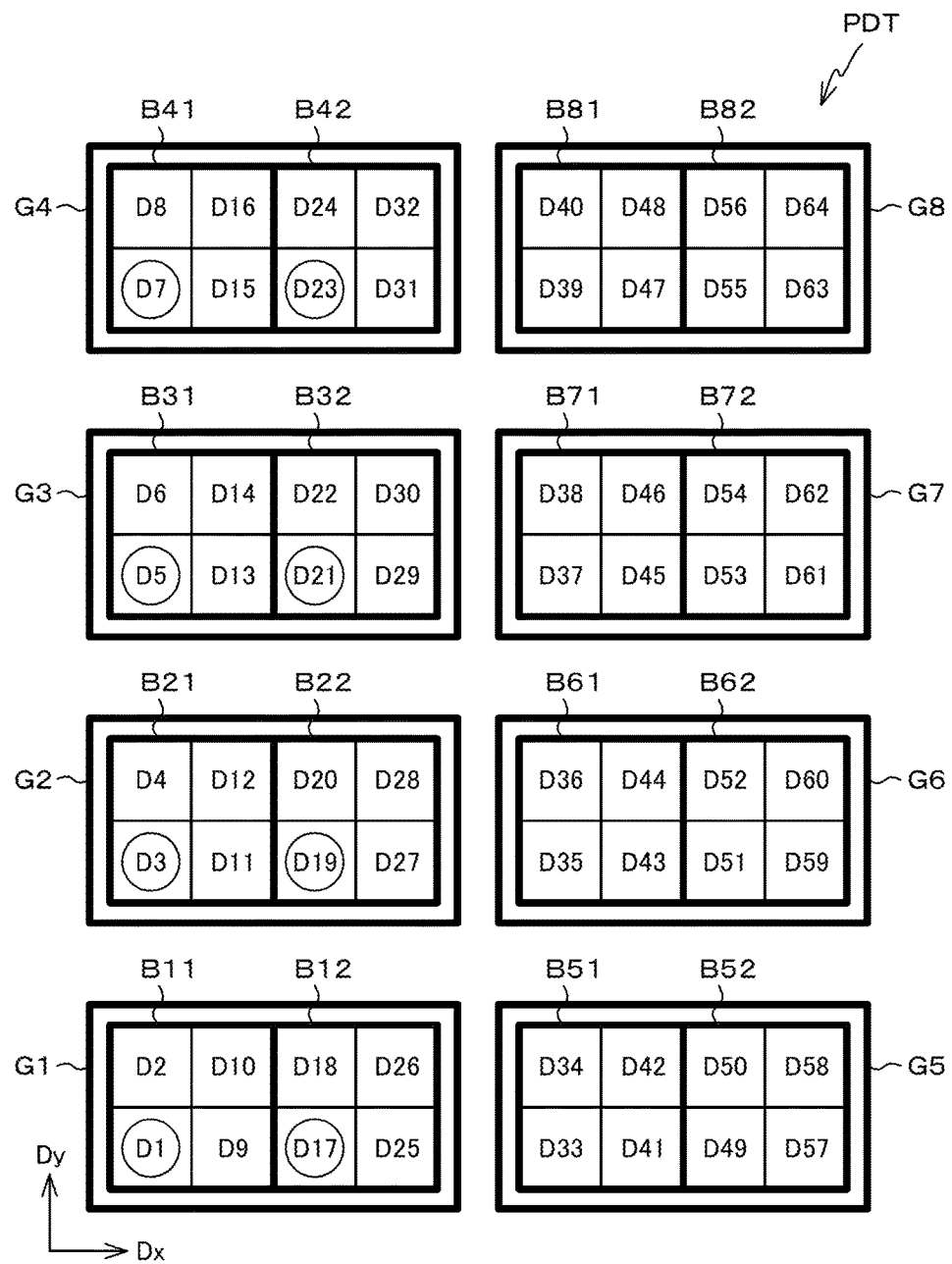
FIG. 25 is a diagram for describing a process of calculating a checksum for each arrangement rank of unit data.
Figure 26:
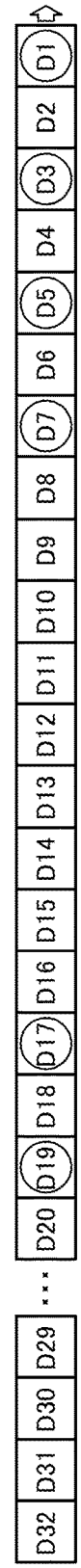
FIG. 26 is a supplemental diagram for describing a method of calculating a checksum.

As shown in FIGS. 25 and 26, the BAA controller 104 calculates a checksum CS1 by summing the values of the first unit data D1, D3, D5, D7, D17, D19, D21, and D23 of each block B11, B21, B31, B41, B12, B22, B32, and B42. Similarly, the BAA controller 104 calculates checksums CS2 to CS4 by summing the second to fourth unit data of each block B11, B21, B31, B41, B12, B22, B32, and B42.

The following checksums CS1 to CS4 obtained in this manner are based on the arrangement ranks of the unit data in the image data PDT. If the checksums CS1 to CS4 are calculated as described below, the number of the checksums becomes equal to the number of the unit data in the block. For this reason, a data area for storing the checksums can be reduced, compared to a case where the checksum is calculated for each rank (first to eight ranks) of the data group.

$CS1=D1+D3+D5+D7+D17+D19+D21+D23$ $CS2=D2+D4+D6+D8+D18+D20+D22+D24$ $CS3=D9+D11+D13+D15+D25+D27+D29+D31$ $CS4=D10+D12+D14+D16+D26+D28+D30+D32$

The BAA controller 104 calculates checksums of each rank on the unit data sorting rule for each block of the data groups G1 to G4 in the left area of the image data PDT (step S102).

Figure 27:
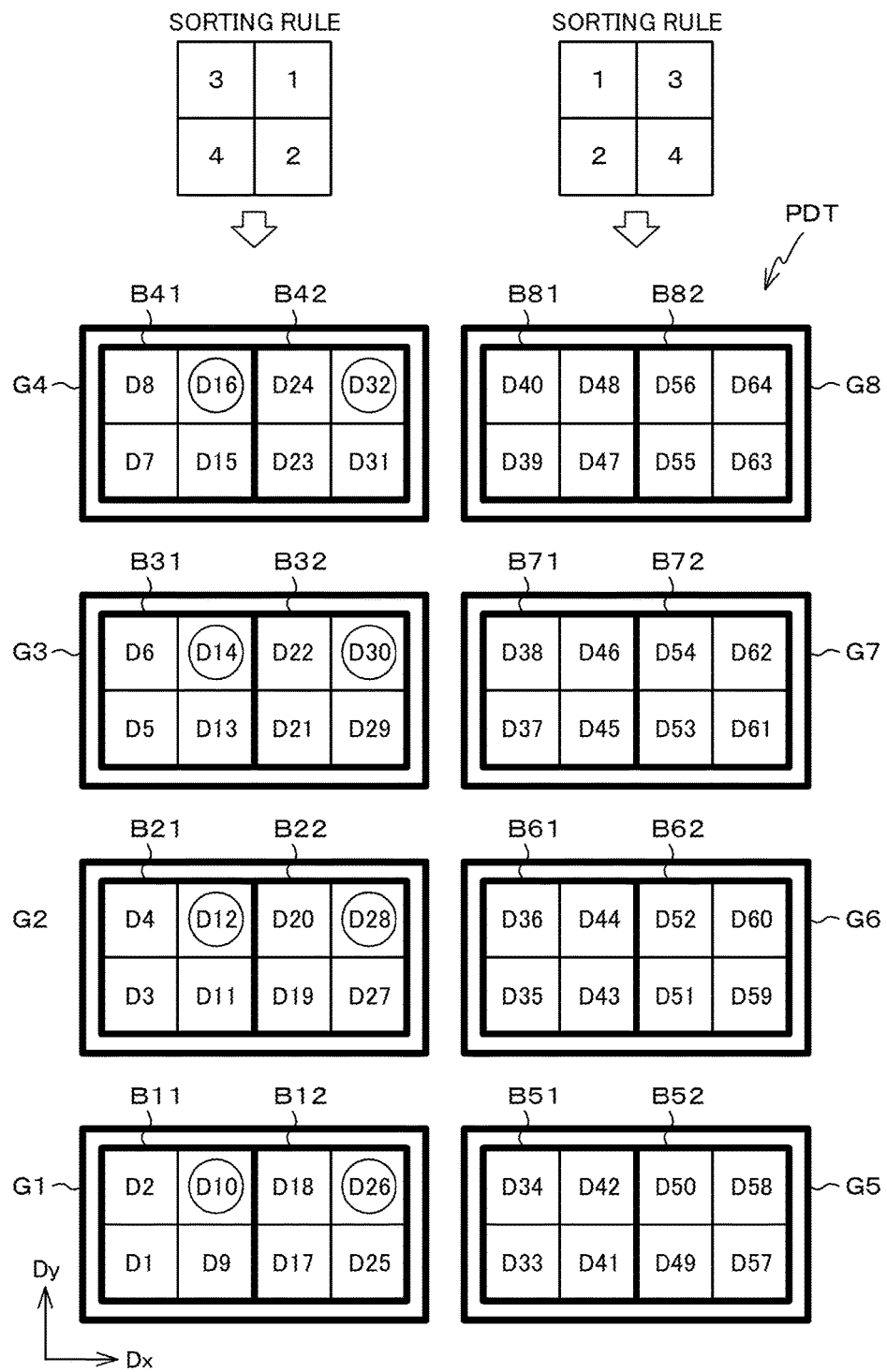
FIG. 27 is a diagram for describing a process of calculating a checksum according to a sorting rule.
Figure 28:
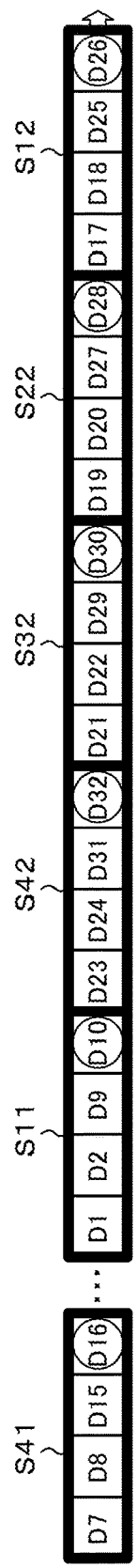
FIG. 28 is a supplemental diagram for describing a method of calculating a checksum.

As recognized from FIGS. 27 and 28, the BAA controller 104 calculates a checksum ACS1 by summing the values of the first unit data D10, D12, D14, D16, D26, D28, D30, and D32 on the sorting rule of each block B11, B21, B31, B41, B12, B22, B32, and B42. Similarly, the BAA controller 104 calculates checksums ACS2 to ACS4 by summing the second to fourth unit data of each block B11, B21, B31, B41, B12, B22, B32, and B42.

The checksums ACS1 to ACS4 obtained in this manner are based on the arrangement rank of the sorting rule.

$ACS1=D26+D28+D30+D32+D10+D12+D14+D16$ $ACS2=D25+D27+D29+D31+D9+D11+D13+D15$ $ACS3=D18+D20+D22+D24+D2+D4+D6+D8$ $ACS4=D17+D19+D21+D23+D1+D3+D5+D7$

The BAA controller 104 calculates checksums of each arrangement rank of the unit data for each block of the data groups G5 to G8 in the right area of the image data PDT of FIG. 13 (step S103). The following resultant checksums CS5 to CS8 are based on the arrangement rank of the unit data in the image data PDT.

$$CS5=D33+D35+D37+D39+D49+D51+D53+D55$$

$$CS6=D34+D36+D38+D40+D50+D52+D54+D56$$

$$CS7=D41+D43+D45+D47+D57+D59+D61+D63$$

$$CS8=D42+D44+D46+D48+D58+D60+D62+D64$$

As shown in FIG. 27, the BAA controller 104 calculates checksums of each rank on the unit data sorting rule for each block of the data groups G5 to G8 in the right area of the image data PDT (step S104). The following resultant checksums ACS5 to ACS8 are based on the arrangement rank on the sorting rule.

$$ACS5=D34+D36+D38+D40+D50+D52+D54+D56$$

$$ACS6=D33+D35+D37+D39+D49+D51+D53+D55$$

$$ACS7=D42+D44+D46+D48+D58+D60+D62+D64$$

$$ACS8=D41+D43+D45+D47+D57+D59+D61+D63$$

The BAA controller 104 compares the checksums CS1 to CS8 and the checksums ACS1 to ACS8 (step S105).

Figure 29:
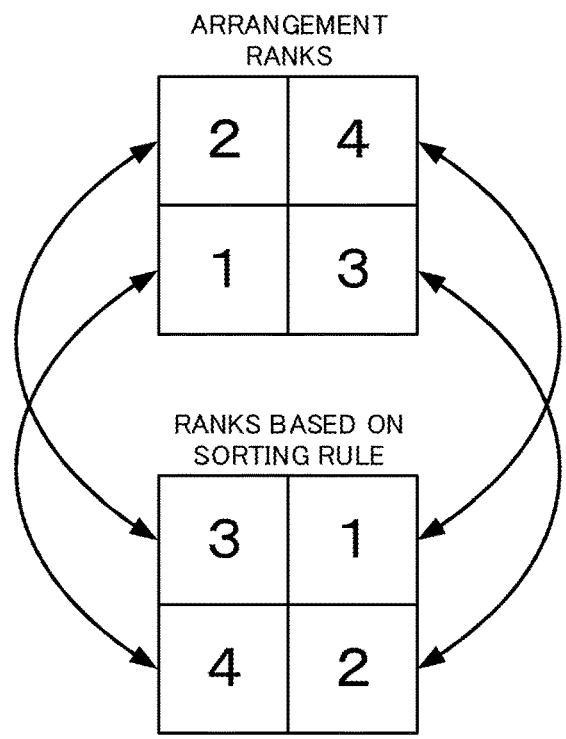
FIG. 29 is a diagram for describing a process of comparing the checksum.

As recognized from FIG. 29, for the data group G1 to G4, the arrangement ranks 1, 2, 3, and 4 correspond to the sorting rule ranks 4, 3, 2, and 1. For this reason, it is natural that the unit data of the checksum CS1 matches the unit data of the checksum ACS4, and the checksum CS1 is equal to the checksum ACS4 as illustrated in FIG. 31.

Similarly, it is natural that the checksums CS2, CS3, and CS4 are equal to the checksums ACS3, ACS2, and ACS1, respectively.

Figure 30:
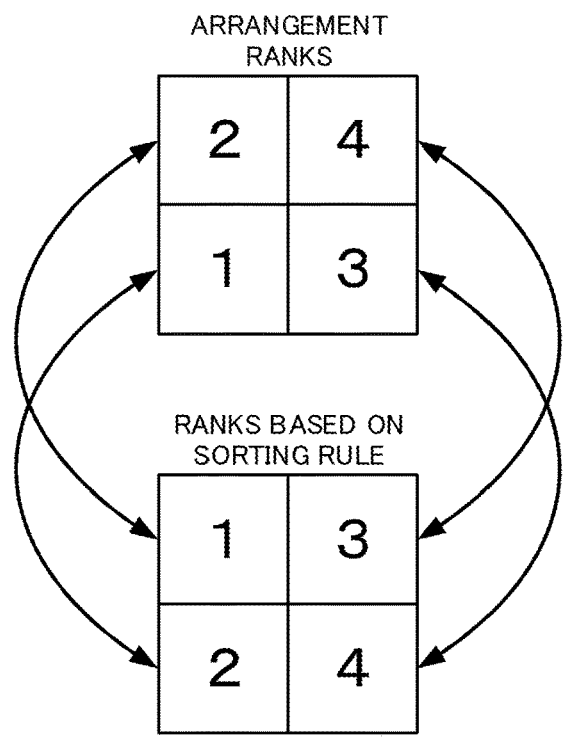
FIG. 30 is a diagram for describing a process of comparing the checksum.

As recognized from FIG. 30, for the data groups G5 to G8, the arrangement ranks 1, 2, 3, and 4 correspond to the sorting rule ranks 2, 1, 4, and 3. For this reason, it is natural that the unit data of the checksum CS5 matches the unit data of the checksum ACS6, and the checksum CS5 is equal to the checksum ACS6 as illustrated in FIG. 31.

Similarly, it is natural that the checksums CS6, CS7, and CS8 are equal to the checksums ACS5, ACS8, and ACS7, respectively.

Here, the BAA controller 104 compares the corresponding checksums with each other as illustrated in FIG. 31.

The BAA controller 104 determines whether or not an error occurs in conversion of the image data PDT on the basis of a result of the checksum comparison (step S106). The BAA controller 104 determines that there is an error in conversion of the image data PDT if there is a difference between the corresponding checksums (YES in step S106). For example, if the checksum CS11 has a value of "X," and the checksum ACS14 has a value of "Y" different from "X," it is determined that there is an error in conversion of the image data PDT.

Meanwhile, if the corresponding checksums have an identical value, the BAA controller 104 determines that there is no error in conversion of the image data PDT (NO in step S106). For example, if the checksum CS11 has a value of "Z," and the checksum ACS14 also has a value of "Z," it is determined that there is no error in conversion of the image data PDT.

If there is an error in conversion of the image data PDT, the BAA controller 104 notifies a result of the checksum comparison, for example, to the controller 101 (step S107). As a result, for example, patterning on the specimen 120 is interrupted.

Figure 32:
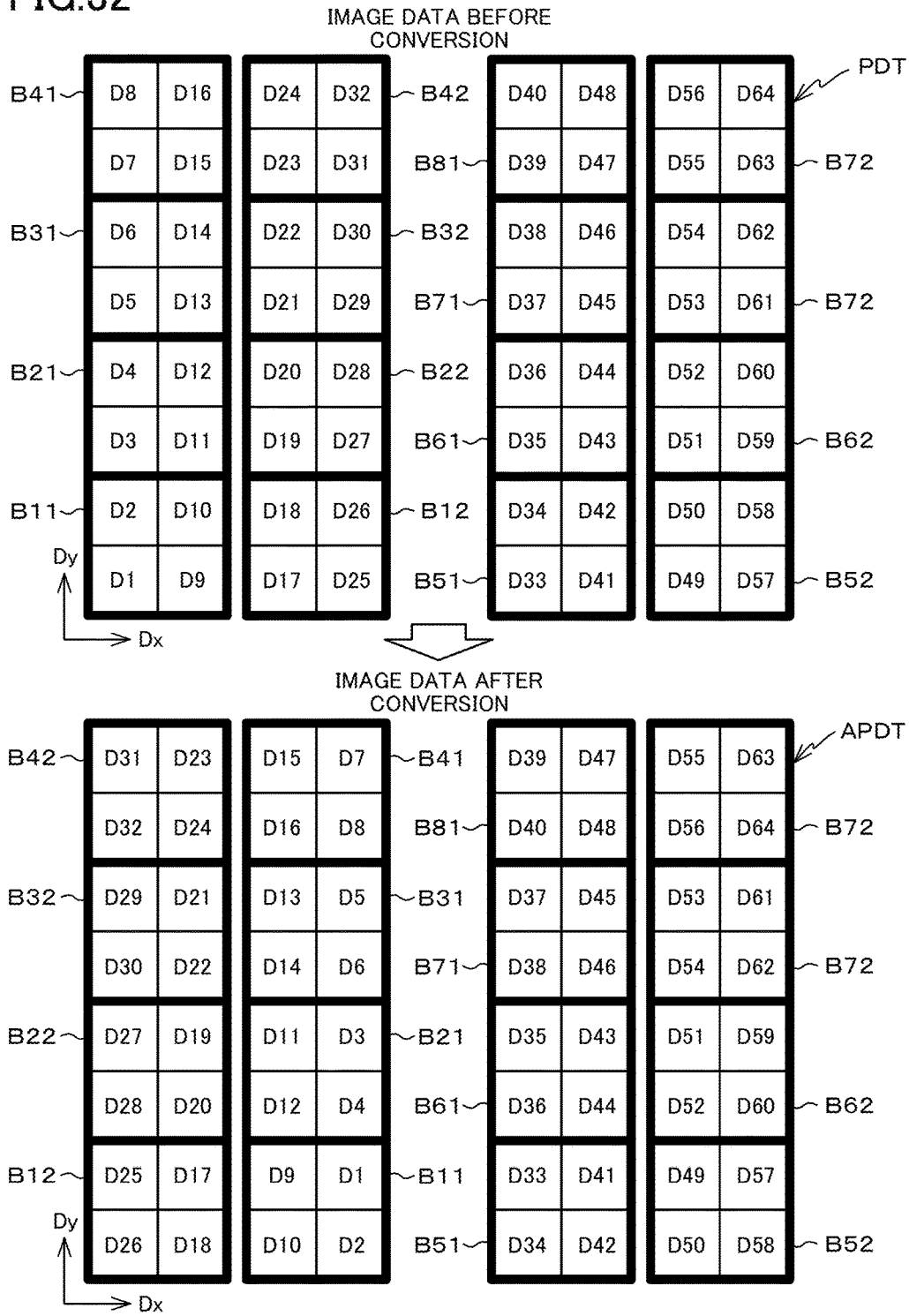
FIG. 32 is a diagram conceptually illustrating original image data and image data equivalent to serial data.

FIG. 32 is a diagram conceptually illustrating the original image data PDT and image data APDT equivalent to the serial data obtained by converting the original image data PDT. As shown in FIG. 32, in the electron beam lithography apparatus 10, the data are output while the positions of the blocks B11, B21, B31, and B41 in the original image data PDT are exchanged with the positions of the blocks B12, B22, B32, and B42.

In this regard, in order to diagnose an error generated by the block exchange, the BAA controller 104 calculates a checksum based on the original image data PDT (step S108).

Specifically, the BAA controller 104 calculates a checksum CSB1 by summing the unit data of the blocks B11, B21, B31, and B41 of the image data PDT and calculates a checksum CSB2 by summing the unit data of the blocks B12, B22, B32, and B42. The checksum CSB1 can be calculated on the basis of the following Equation (1). In addition, the checksum CSB2 can be calculated on the basis of the following Equation (2).

$$CSB1=D1+D2+D9+D10+D3+D4+\ldots+D16 \quad (1)$$

$$CSB2=D17+D18+D25+D26+D19+D20+\ldots+D32 \quad (2)$$

The BAA controller 104 calculates a checksum based on the image data APDT equivalent to the serial data (step S109).

Specifically, the BAA controller 104 calculates the checksum ACSB1 by summing the unit data of the blocks B11, B21, B31, and B41 of the image data APDT and calculates the ACSB2 by summing the unit data of the blocks B12, B22, B32, and B42. The checksum ACSB1 can be calculated on the basis of the following Equation (3). The checksum ACSB2 can be calculated on the basis of the following Equation (4).

$$ACSB1=D10+D9+D2+D1+D12+D11+\ldots+D7 \quad (3)$$

$$ACSB2=D26+D25+D18+D17+D28+D27+\ldots+D23 \quad (4)$$

The BAA controller 104 compares the checksums CSB1 and CSB2 and the checksums ACSB1 and ACSB2 (step S110).

As shown in FIG. 32, it is natural that the checksum CSB1 representing a sum of the unit data of the blocks B11, B21, B31, and B41 of the image data PDT is equal to the checksum ACSB1 representing a sum of the unit data of the blocks B11, B21, B31, and B41 of the image data APDT. Similarly, it is natural that the checksum CSB2 representing a sum of the unit data of the blocks B12, B22, B32, and B42 of the image data PDT is equal to the checksum ACSB2 representing a sum of the unit data of the blocks B12, B22, B32, and B42 of the image data APDT.

Then, the BAA controller 104 determines whether or not an error is generated from the block exchange process on the basis of a result of the checksum comparison (step S111). If there is a difference between the corresponding checksums, the BAA controller 104 determines that there is an error in conversion of the image data PDT (YES in step S111). For example, if the checksum CSB1 has a value of "X," and the checksum ACSB1 has a value of "Y" different from "X," it is determined that there is an error in the block exchange process.

Meanwhile, if the values of the corresponding checksums are equal to each other, the BAA controller 104 determines that there is no error in the block exchange process (NO in step S111). For example, if the checksum CSB1 has a value of "Z," and the checksum ACSB1 has the identical value of "Z," it is determined that there is no error in the block exchange process.

If there is an error in the block exchange process, the BAA controller 104 notifies the controller 101 of a result of the checksum comparison, for example, (step S112). As a result, for example, patterning on the specimen 120 is interrupted.

If the process of step S112 is terminated, or it is determined that there is no error in step S111, the BAA controller 104 terminates the error diagnosis process.

As described above, according to this embodiment, the checksum is calculated for each rank of the unit data contained in the blocks of the image data PDT (steps S101 to S104). For this reason, it is possible to diagnose an error generated in parallel/serial conversion of the image data PDT by comparing the checksums (step S105). As a result, it is possible to detect a conversion error with high accuracy and improve a patterning resolution.

According to this embodiment, when the image data PDT is converted into the image data APDT, the checksum is calculated for each group of the exchanged blocks as illustrated in FIG. 32 (steps S108 and S109). For this reason, by comparing the checksums (step S110), it is possible to diagnose an error generated in the block exchange process. As a result, it is possible to detect a conversion error with high accuracy and improve a patterning resolution.

As described above, according to this embodiment, a diagnosis can be performed for each particular process such as parallel/serial conversion of the image data PDT or the block exchange process. Therefore, it is possible to easily specify when a patterning error is generated during the processing and reduce a downtime of the system.

While embodiments according to the present disclosure have been described, they are not intended to limit the scope of the present disclosure. For example, although a dose of the electron beams EBmn is determined on the basis of the values of the unit data D1 to D64, various other methods may also be employed to control the dose of the electron beams EBmn. For example, the dose of the electron beams EBmn may be controlled in an ON/OFF manner on the basis of the values of the unit data D1 to D64. In addition, the unit data D1 to D64 may have a bit length of several bits to several tens of bits, and the electron beam irradiation time may be controlled depending on the bit value. As a result, marks Mmn having various gradations can be formed. An example of the dose control will be described below.

<Dose Control>

Figure 33:
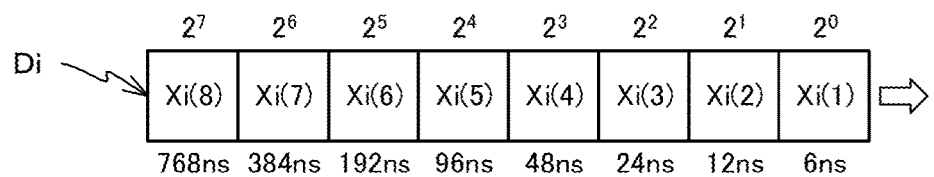
FIG. 33 is a schematic diagram illustrating unit data.

FIG. 33 is a schematic diagram illustrating unit data Di (where "i"=1 to 64). The unit data Di (where "i"=1 to 64) are, for example, 8-bit data, and first to eighth bit data are set to Xi(1) to Xi(8), respectively. The bit data Xi(1) to Xi(8) has a value of "1" or "0." The irradiation time of the electron beam EBmn is allocated to the bit data Xi(1) to Xi(8). In the electron beam lithography apparatus 10, for example, the irradiation times 6 ns, 12 ns, 24 ns, 48 ns, 96 ns, 192 ns, 384 ns, and 768 ns are allocated to the bit data Xi(1) to Xi(8), respectively, as illustrated in FIG. 33. For this reason, the irradiation time IT (ns) shown in the unit data Di can be represented as the following Equation (5). For example, if the unit data Di (Xi(1) to Xi(8)) is set to [10100000], the irradiation time IT becomes 30 ns (=6·1+24·1).

$$IT = 6Xi(1) + 12Xi(2) + 24Xi(3) + 48Xi(4) + 96Xi(5) + 192Xi(6) + 384Xi(7) + 768Xi(8) \quad (5)$$

The BAA controller 104 sorts the bit data of the unit data Di on the basis of a predetermined rule. For example, if the ON/OFF control of the electron beams EBmn is performed sequentially from the first bit of the bit data Xi(1) to the eighth bit of the bit data Xi(8), the ON/OFF switching control of the electron beam EBmn for every short interval such as 6 ns, 12 ns, or 24 ns may be necessary in the first half. In this regard, the BAA controller 104 performs the exchange process of the bit data Xi(1) to Xi(8) of the unit data Di on the basis of a predetermined rule.

Figure 34:
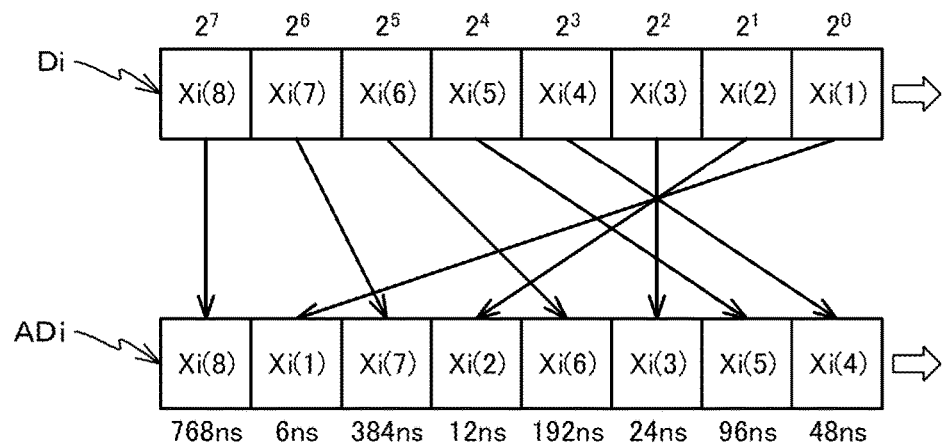
FIG. 34 is a diagram for describing a bit data exchange process.

For example, the BAA controller 104 combines the bit data Xi1 representing "6 ns" and the bit data Xi8 representing "768 ns" as illustrated in FIG. 34. Similarly, the bit data Xi(2) representing "12 ns" and the bit data Xi(7) representing "384 ns" are combined. The bit data Xi(3) representing "24 ns" and the bit data Xi(6) representing "192 ns" are combined. The bit data Xi(4) representing "48 ns" and the bit data Xi(5) representing "96 ns" are combined. As a result, the unit data Di is converted into unit data ADi [Xi(4), Xi(5), Xi(3), Xi(6), Xi(2), Xi(7), Xi(1), and Xi(8)].

From the converters 621 to 628, the data DXi(4) to DXi(8) corresponding to the first bit of the bit data Xi(4) to the eighth bit of the bit data Xi(8) of the unit data ADi are sequentially output. Note that the data DXi(1) to DXi(8) are data for turning on the electron beam EBmn only for the irradiation time allocated to the bit data Xi(1) to Xi(8).

For example, the converter 621 outputs data DX26(4), DX25(4), DX18(4), and DX17(4) corresponding to the first bits X26(4), X25(4), X18(4), and X17(4) of the unit data D26, D25, D18, and D17, respectively, to the output lines L1 to L4. Then, the converter 621 outputs data DX10(4), DX9(4), DX2(4), and DX1(4) corresponding to the first bits X10(4), X9(4), X2(4), and X1(4) of the unit data D10, D9, D2, and D1, respectively, to the output lines L1 to L4. Similarly, the converter 621 repeats the above described operation for the second and subsequent bits of the unit data D26, D25, D18, D17, D10, D9, D2, and D1.

If the converters 621 to 628 repeat the above described operation for each bit data of the unit data Di, a mark Mmn having a predetermined gradation is formed.

<Diagnosis Process>

The BAA controller 104 calculates a checksum before and after the bit data exchange process of the unit data Di. For example, the value VDi of the unit data Di itself can be expressed as the following Equation (6). Therefore, the checksum CSD before the sorting of the unit data Di can be obtained using the following Equation (7).

$$VDi = 2^7 Xi(8) + 2^6 Xi(7) + 2^5 Xi(6) + 2^4 Xi(5) + 2^3 Xi(4) + 2^2 Xi(3) + 2^1 Xi(2) + 2^0 Xi(1) \quad (6)$$

$$CSD = \quad (7)$$
$$(X1(8) + X2(8) + \ldots X64(8)) \times 2^7 + (X1(7) + X2(7) + \ldots X64(7)) \times$$
$$2^6 + (X1(6) + X2(6) + \ldots X64(6)) \times 2^5 +$$
$$(X1(5) + X2(5) + \ldots X64(5)) \times 2^4 +$$
$$(X1(4) + X2(4) + \ldots X64(4)) \times 2^3 +$$
$$(X1(3) + X2(3) + \ldots X64(3)) \times 2^2 +$$
$$(X1(2) + X2(2) + \ldots X64(2)) \times 2^1 +$$
$$(X1(1) + X2(1) + \ldots X64(1)) \times 2^0 = k8 \times 2^7 + k7 \times 2^6 +$$
$$k6 \times 2^5 + k5 \times 2^4 + k4 \times 2^3 + k3 \times 2^2 + k2 \times 2^1 + k1 \times 2^0$$

The BAA controller 104 calculates the checksum ACSD for the unit data ADi [Xi(8), Xi(1), Xi(7), Xi(2), Xi(6), Xi(3), Xi(5), and Xi(4)] created by exchanging the bit data Xi(1) to Xi(8) of the unit data Di.

Specifically, the BAA controller 104 first calculates a sum Σ(j) of the bit data of the (j)th rank (j=1 to 8) from the bit data Xi(1) to Xi(64) of the sixty four unit data ADi on the basis of the following Equations (8) to (15).

$$\Sigma(1)=X1(4)+X2(4)+ \ldots +X64(4) \quad (8)$$

$$\Sigma(2)=X1(5)+X2(5)+ \ldots +X64(5) \quad (9)$$

$$\Sigma(3)=X1(3)+X2(3)+ \ldots +X64(3) \quad (10)$$

$$\Sigma(4)=X1(6)+X2(6)+ \ldots +X64(6) \quad (11)$$

$$\Sigma(5)=X1(2)+X2(2)+ \ldots +X64(2) \quad (12)$$

$$\Sigma(6)=X1(7)+X2(7)+ \ldots +X64(7) \quad (14)$$

$$\Sigma(7)=X1(1)+X2(1)+ \ldots +X64(1) \quad (13)$$

$$\Sigma(8)=X1(8)+X2(8)+ \ldots +X64(8) \quad (15)$$

As recognized by comparing Equations (8) to (15) with Equation (7), if the exchange process of the bit data Xi(1) to Xi(8) is successful, the sum Σ(1) is equal to a coefficient "k4." Similarly, the sum Σ(2) is equal to the coefficient "k5." The sum Σ(3) is equal to the coefficient "k3." The sum Σ(4) is equal to the coefficient "k6." The sum Σ(5) is equal to the coefficient "k2." The sum Σ(6) is equal to the coefficient "k7." The sum Σ(7) is equal to the coefficient "k1." The sum Σ(8) is equal to the coefficient "k8."

In this regard, the BAA controller 104 calculates the checksum ACSD using the following Equation (16).

$$ACSD=\Sigma(8)\times 2^7+\Sigma(7)\times 2^6+\Sigma(6)\times 2^5+\Sigma(5)\times 2^4+\Sigma(4)\times 2^3+ \\ \Sigma(3)\times 2^2+\Sigma(2)\times 2^1+\Sigma(1)\times 2^0 \quad (16)$$

The BAA controller 104 compares the checksums CSD and ACSD calculated as described above. If both the checksums CSD and ACSD are equal to each other, the BAA controller 104 determines that the exchange process of the bit data Xi(1) to Xi(8) is successful. Otherwise, if the checksums CSD and ACSD have different values as a result of comparison, the BAA controller 104 determines that there is an error in the exchange process of the bit data Xi(1) to Xi(8). In this case, the patterning on the specimen 120 may be interrupted. As a result, it is possible to improve a patterning resolution.

While the embodiments of the present disclosure and their modifications have been described, it would be appreciated that they are not intended to limit the scope of the present disclosure. For example, although the electron beam lithography apparatus draws a pattern using sixty four electron beams EBmn in the above described embodiments, the electron beam lithography apparatus 10 may draw a pattern using sixty five or more electron beams or sixty three or less electron beams without a particular limitation.

In the embodiments described above, the unit data Di of the image data PDT are divided into eight data groups G1 to G8 as illustrated in FIG. 12. Alternatively, the unit data may be divided into seven or less data groups or nine or more data groups depending on the number of unit data of the image data PDT without a particular limitation.

In the embodiments described above, each of the converters 621 to 628 outputs eight unit data as illustrated in FIG. 6. Alternatively, one converter may process nine or more unit data depending on a specification of the converter without a particular limitation.

In the embodiments described above, the BAA controller 104 executes the error diagnosis process of FIG. 24. Alternatively, the error diagnosis process may be executed by devices other than the BAA controller 104 such as the controller 101 or any external device without a particular limitation.

The functions of the BAA controller 104 according to each embodiment of the disclosure may be implemented in a dedicated hardware device or a typical computer system. The program executed by the BAA controller 104 may be distributed while being stored in a computer-readable recording medium such as a flexible disk, a compact disc read-only memory (CD-ROM), a digital versatile disk (DVD). Alternatively, the program may also be installed in the BAA controller 104 via the Internet.

A part of or the entirety of the programs described above may be executed, for example, on a server, and information relating to execution thereof may be received by the BAA controller 104 through a communication network to execute the error diagnosis process.

While several embodiments according to the present invention have been described, they are just for exemplary purposes and are not intended to limit the scope of the invention. These novel embodiments may be embodied in various other forms, and various omissions, substitutions, or modifications may also be possible without departing from the scope and spirit of the invention. Such various embodiments or modifications should be construed as being included in the scope and spirit of the invention contained in the attached claims and equivalents thereof.

The invention claimed is:

1. A method of diagnosing a conversion process for converting a format of image data including unit data, wherein the data is divided into blocks and units of each block are ranked, corresponding to charged particle beams into a format suitable for an aperture array, the aperture array having a plurality of controllers provided to match a plurality of the charged particle beams to control the charged particle beams and a driver configured to drive the controllers, the method comprising:
    extracting the unit data having an identical first rank based on an arrangement of the unit data in the image data from the unit data of each block including a predetermined number of the unit data and calculating a first checksum of the unit data having the same first rank;
    extracting the unit data having an identical second rank after the conversion process from the unit data of each of the blocks and calculating a second checksum of the unit data having the same second rank;
    comparing the first and second checksums; and
    controlling the aperture array to control the plurality of charged particle beams according to a result of the comparing.

2. The method according to claim 1, wherein the driver is provided in each group having a predetermined number of the controllers, further comprising dividing the unit data into the blocks having the unit data corresponding to an output of the driver.

3. The method according to claim 1, wherein the number of the unit data in each of the blocks is identical one another between the blocks.

4. The method according to claim 1, further comprising:
    dividing each of the blocks into a first block and a second block;
    calculating a third checksum based on the unit data included in the first block;
    calculating a fourth checksum based on the unit data included in the second block; and
    comparing the third checksum with the fourth checksum.

5. The method according to claim 4, wherein a count of the unit data of the first block is equal to a count of the unit data of the second block.

6. The method according to claim 1, wherein the unit data include a plurality of bit data arranged based on a third rank different from the first rank and the second rank,
the method further comprising:
calculating a sum of values of the plurality of unit data as a fifth checksum;
summing the bit data of the unit data in the third rank;
calculating a sixth checksum based on a result of the summing; and
comparing the fifth checksum with the sixth checksum.

7. The method according to claim 6, wherein a time for defining a dose of the charged particle beam is allocated to the bit data.

8. The method according to claim 6, wherein the bit data are paired, and
the bit data are arranged such that a difference of the dose defined by the pair of the bit data is minimized between the pair of bit data.

9. A charged particle beam lithography apparatus comprising:
an aperture array having a plurality of controllers provided to match a plurality of charged particle beams to control the charged particle beams and a driver configured to drive the controllers;
a converter configured to convert a format of image data having unit data wherein the data is divided into blocks and the units of each block are ranked, corresponding to the charged particle beams into a format suitable for the aperture array;
a first calculator configured to extract the unit data having an identical first rank based on the arrangement of the unit data of the image data from the unit data of each block having a predetermined number of the unit data and calculate a first checksum of the unit data having the same first rank;
a second calculator configured to extract the unit data having an identical second rank after the conversion of the converter from the unit data of each of the blocks and calculate a second checksum of the unit data having the same second rank; and
a first comparator configured to compare the first checksum with the second checksum.

10. The charged particle beam lithography apparatus according to claim 9, wherein the driver is provided in each group having a predetermined number of the controllers, and
the unit data are divided into the blocks having the unit data matching the output of the driver.

11. The charged particle beam lithography apparatus according to claim 9, wherein each of the blocks is divided into a first block and a second block, further comprising:
a third calculator configured to calculate a third checksum based on the unit data of the first block;
a fourth calculator configured to calculate a fourth checksum based on the unit data of the second block; and
a second comparator configured to compare the third checksum with the fourth checksum.

12. The charged particle beam lithography apparatus according to claim 9, wherein the unit data include a plurality of bit data arranged based on a third rank different from the first rank and the second rank, further comprising:
a fifth calculator configured to calculate a sum of values of the plurality of unit data as a fifth checksum;
a summer configured to sum the bit data of the unit data of the third rank;
a sixth calculator configured to calculate a sixth checksum based on a result of the summing of the summer; and
a third comparator configured to compare the fifth checksum with the sixth checksum.

13. The charged particle beam lithography apparatus according to claim 12, wherein a time for defining a dose of the charged particle beam is allocated to the bit data.

14. The charged particle beam lithography apparatus according to claim 12, wherein the bit data are paired, and
the bit data are arranged such that a difference of the dose defined by the pair of bit data is minimized between the pair of bit data.

15. A non-transitory computer readable recording medium storing a program for diagnosing a conversion process for converting a format of image data including unit data wherein the data is divided into blocks and units of each block are ranked, corresponding to charged particle beams into a format suitable for an aperture array, the aperture array having a plurality of controllers provided to match a plurality of the charged particle beams to control the charged particle beams, and a driver configured to drive the controllers, wherein
the program causes a computer to execute:
extracting the unit data having an identical first rank based on an arrangement of the unit data in the image data from the unit data of each block including a predetermined number of the unit data and calculating a first checksum of the unit data having the same first rank;
extracting the unit data having an identical second rank after the conversion process from the unit data of each of the blocks and calculating a second checksum of the unit data having the same second rank;
comparing the first checksum with the second checksum; and
controlling the aperture array to control the plurality of charged particle beams according to a result of the comparing.

16. The non-transitory computer readable recording medium according to claim 15, wherein the driver is provided in each group having a predetermined number of the controllers, further comprising dividing the unit data into the blocks having the unit data corresponding to an output of the driver.

17. The non-transitory computer readable recording medium according to claim 15,
wherein the program causes the computer to further execute:
dividing each of the blocks into a first block and a second block;
calculating a third checksum based on the unit data included in the first block;
calculating a fourth checksum based on the unit data included in the second block; and
comparing the third checksum with the fourth checksum.

18. The non-transitory computer readable recording medium according to claim 15,
wherein the unit data include a plurality of bit data arranged based on a third rank different from the first rank and the second rank,
the program causes the computer to further execute:
calculating a sum of values of the plurality of unit data as a fifth checksum;
summing the bit data of the unit data in the third rank;
calculating a sixth checksum based on a result of the summing; and
comparing the fifth checksum with the sixth checksum.

19. The non-transitory computer readable recording medium according to claim 18, wherein a time for defining a dose of the charged particle beam is allocated to the bit data.

20. The non-transitory computer readable recording medium according to claim 18, wherein, the bit data are paired, and the bit data are arranged such that a difference of the dose defined by the pair of the bit data is minimized between the pair of bit data.

* * * * *